United States Patent
Yeo et al.

(10) Patent No.: US 12,032,404 B2
(45) Date of Patent: Jul. 9, 2024

(54) DISPLAY DEVICE HAVING A DISPLAY PANEL INCLUDING A MEMBER FOR INDUCING A MAGNETIC FIELD

(71) Applicant: Samsung Display Co., Ltd., Yongin-Si (KR)

(72) Inventors: So Young Yeo, Suwon-si (KR); Yi Joon Ahn, Seoul (KR); Jae Been Lee, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 54 days.

(21) Appl. No.: 16/916,640

(22) Filed: Jun. 30, 2020

(65) Prior Publication Data

US 2021/0132654 A1 May 6, 2021

(30) Foreign Application Priority Data

Nov. 4, 2019 (KR) .......................... 10-2019-0139756

(51) Int. Cl.
| | |
|---|---|
| *G06F 1/16* | (2006.01) |
| *H04R 1/02* | (2006.01) |
| *H04R 9/06* | (2006.01) |
| *H05K 1/02* | (2006.01) |
| *H05K 5/00* | (2006.01) |

(52) U.S. Cl.
CPC .......... *G06F 1/1626* (2013.01); *G06F 1/1605* (2013.01); *H04R 1/028* (2013.01); *H04R 9/06* (2013.01); *H05K 1/0209* (2013.01); *H05K 5/0017* (2013.01)

(58) Field of Classification Search
CPC ..... G06F 1/1626; G06F 1/1605; H04R 1/028; H04R 9/06; H05K 1/0209; H05K 5/0017
See application file for complete search history.

(56) References Cited

U.S. PATENT DOCUMENTS

| | | | |
|---|---|---|---|
| 9,900,988 B1 * | 2/2018 | Chao | .................... H05K 3/0014 |
| 10,365,685 B2 | 7/2019 | Lee et al. | |
| 2002/0191808 A1 | 12/2002 | Croft, III et al. | |
| 2012/0121121 A1 * | 5/2012 | Wilk | ..................... H04R 9/045 |
| | | | 381/400 |
| 2015/0264486 A1 | 9/2015 | Yuan et al. | |
| 2016/0212546 A1 | 7/2016 | Salvatti | |
| 2019/0004566 A1 | 1/2019 | Lee et al. | |

FOREIGN PATENT DOCUMENTS

| | | | | |
|---|---|---|---|---|
| EP | 3330780 A1 * | 6/2018 | ....... | G02F 1/133308 |
| KR | 2019-0004197 | 1/2019 | | |
| KR | 2019-0037729 | 4/2019 | | |
| WO | WO-2016175592 A1 * | 11/2016 | ............... | H04R 7/04 |

* cited by examiner

*Primary Examiner* — Wing H Chow
(74) *Attorney, Agent, or Firm* — CANTOR COLBURN LLP

(57) ABSTRACT

A display device includes: a display panel including a plurality of pixels; a layer disposed on one surface of the display panel and including a substantially flat member to induce a magnetic field; and a support spaced apart from the display panel with the layer interposed therebetween and having a fixed magnetic field generation member disposed therein.

13 Claims, 22 Drawing Sheets

DISPLAY DEVICE HAVING A DISPLAY PANEL INCLUDING A MEMBER FOR INDUCING A MAGNETIC FIELD

This application claims priority from and the benefit of Korean Patent Application No. 10-2019-0139756 filed on Nov. 4, 2019, which is incorporated by reference for all purposes as if fully set forth herein.

BACKGROUND

Field

Exemplary implementations of the invention relate generally to a display device and, more particularly, to a display device having a sound generator.

Discussion of the Background

As an information society develops, demand for a display device to display an image is increasing in various forms. For example, the display device is applied to various electronic devices such as a smart phone, a digital camera, a notebook computer, a navigation system, and a smart television. The display device can include a display panel configured to display an image, and a sound generator providing sound.

The sound generator has a predetermined volume to generate vibrations. Many studies are in progress to reduce the volume, specifically, a thickness, of the sound generator.

SUMMARY

Display devices constructed according to the principles and exemplary implementations of the invention have a reduced overall thickness achieved by reducing the thickness of the sound generator. For example, the sound generator may be formed from a fixed magnetic field generation member and induced magnetic field generation member, which may be disposed in a layer of the panel display panel, configured as a substantially flat coil and/or embedded in a display circuit board to reduce the overall thickness of the sound generator and the display device.

Additional features of the inventive concepts will be set forth in the description which follows, and in part will be apparent from the description, or may be learned by practice of the inventive concepts.

According to one aspect of the invention, a display device includes: a display panel including a plurality of pixels; a layer disposed on one surface of the display panel and including a substantially flat member to induce a magnetic field; and a support spaced apart from the display panel with the layer interposed therebetween and having a fixed magnetic field generation member disposed therein.

The substantially flat member may include a substantially flat coil disposed in a panel layer.

The panel layer may include a panel lower sheet of the display panel including a heat dissipation layer; and the substantially flat member may include a substantially flat coil disposed on the same layer as the heat dissipation layer.

The heat dissipation layer may include a first heat dissipation layer, and a second heat dissipation layer disposed between the first heat dissipation layer and the display panel; the first heat dissipation layer may include copper or silver; and the second heat dissipation layer may include graphite or a carbon nanotube.

The first heat dissipation layer may include a lower heat dissipation layer and the substantially flat coil and lower heat dissipation layer may be disposed on the same layer; and the lower heat dissipation layer may be spaced apart from the substantially flat coil.

The second heat dissipation layer may include an upper heat dissipation layer and the substantially flat coil and upper lower heat dissipation layer may be disposed on the same layer; and the upper heat dissipation layer may be spaced apart from the substantially flat coil.

The fixed magnetic field generation member may include a magnet overlapping the substantially flat coil in a thickness direction.

The support may include a bracket, including a first bracket part in which the magnet may be disposed and a second bracket part in which the magnet may not be disposed; the first bracket part may extend downward more than the second bracket part; and the magnet may be embedded in the first bracket part.

A sound frame may be disposed on the magnet and overlapping the substantially flat coil.

A damper may be disposed between the second bracket part and the sound frame, the damper contacting the second bracket part and the sound frame.

The magnet may be disposed in the support.

A buffer member may be disposed between the panel lower sheet and the support, the support may include a bracket; wherein the buffer member may contact the panel lower sheet and the bracket.

A printed circuit board may be attached to one end of the display panel, and bent to be disposed between the support and the layer; wherein the substantially flat member may be electrically connected to the printed circuit board through a connection member.

According to another aspect of the invention, a display device includes: a display panel including a plurality of pixels; a layer disposed on one surface of the display panel and including a substantially flat member to induce a magnetic field; a support spaced apart from the display panel with the layer interposed therebetween and having a fixed magnetic field generation member disposed therein; and a printed circuit board attached to one end of the display panel, and bent to be disposed between the support and the panel lower sheet; wherein the substantially flat member may overlap the fixed magnetic field generation member in a thickness direction, and the printed circuit board may overlap the substantially flat member in the thickness direction.

The substantially flat member may include a substantially flat coil disposed in the printed circuit board and the fixed magnetic field generation member may include a magnet.

The substantially flat coil may be disposed between the printed circuit board and the layer, and attached to the printed circuit board.

The substantially flat coil may be disposed between the printed circuit board and the magnet, and attached to the printed circuit board.

The substantially flat member may include a substantially flat coil disposed in the layer.

The layer may include a lower sheet of the display panel and may include a heat dissipation layer; the heat dissipation layer may include a lower heat dissipation layer, and an upper heat dissipation layer may be disposed between the lower heat dissipation layer and the display panel; the lower heat dissipation layer may include copper or silver; and the upper heat dissipation layer may include a graphite or a carbon nanotube.

The substantially flat coil may be disposed on the same layer as the lower heat dissipation layer or the upper heat dissipation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
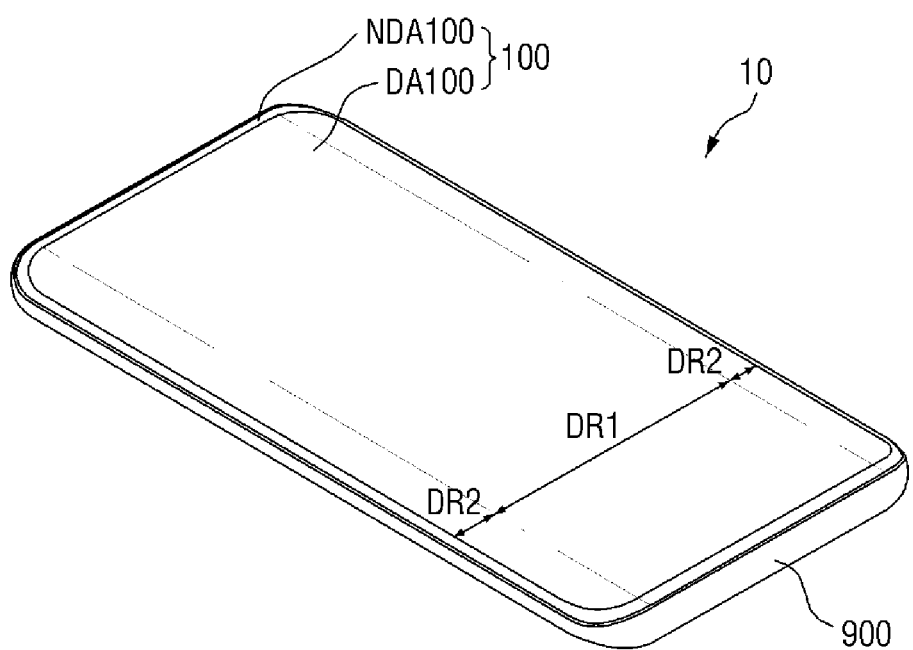
FIG. 1 is a perspective view of an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Other expressions that explain the relationship between elements, such as "between," "directly between," "adjacent to," or "directly adjacent to," should be construed in the same way. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. For example, "about" can mean within one or more standard deviations, or within ±30%, 20%, 10% or 5% of the stated value.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
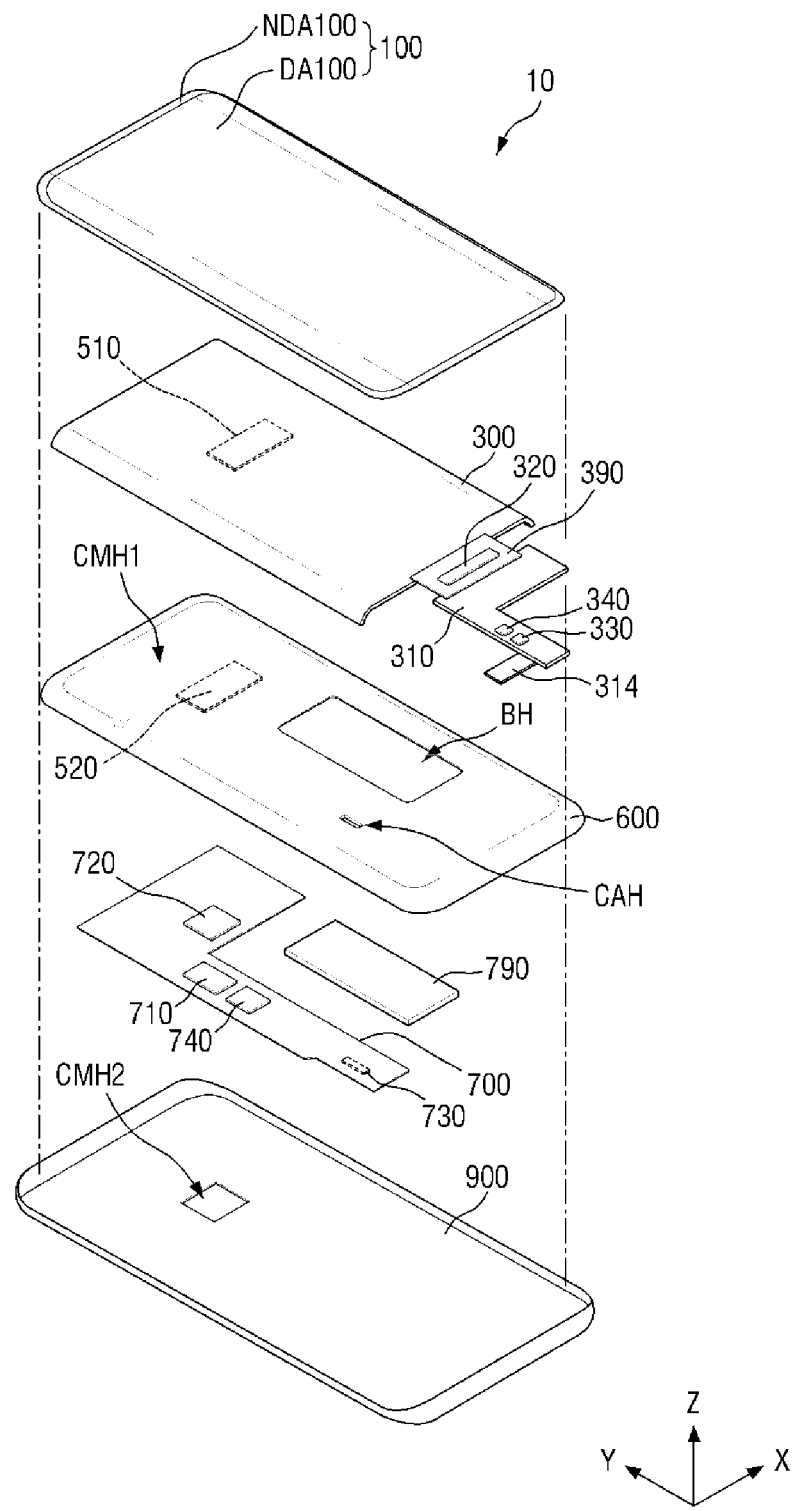
FIG. 2 is an exploded perspective view of the display device of FIG. 1.

FIG. 1 is a perspective view of an exemplary embodiment of a display device constructed according to principles of the invention. FIG. 2 is an exploded perspective view of the display device of FIG. 1.

Referring to FIGS. 1 and 2, a display device 10 includes a cover window 100, a display panel 300, a display circuit board 310, a display driving circuit 320, a flexible film 390, an induced magnetic field generation member 510, a support, which may be in the form of a bracket 600, a main circuit board 700, and a lower cover 900. The display device 10 may further include a sound generator. The sound generator may include the induced magnetic field generation member 510 and a fixed magnetic field generation member 520, which will be described below.

As used herein, "up" refers to a direction in which the cover window 100 is disposed with respect to the display panel 300, that is, a Z-axis direction, and "down" refers to a direction in which the bracket 600 is disposed with respect to the display panel 300, that is, a direction opposite the Z-axis direction. Further, "leftward", "rightward", "upward", and "downward" refer to directions when the display panel 300 is viewed in a plan view. For example, "leftward" refers to a direction opposite an X-axis direction, "rightward" refers to the X-axis direction, "upward" refers to the Z-axis direction, and "downward" refers to the direction opposite the Z-axis direction.

The display device 10 may be formed in a generally rectangular shape in a plan view. For example, as shown in FIGS. 1 and 2, the display device 10 may have a generally rectangular flat shape having short sides in the first direction (the X-axis direction) and long sides in a second direction (a Y-axis direction). An edge where the short side in the first direction (the X-axis direction) and the long side in the second direction (the Y-axis direction) meet may be formed to be generally round to have a generally predetermined curvature or formed at a generally right angle. The shape of the display device 10 in a plan view is not limited to the generally rectangular shape, and the display device 10 may be formed in another generally polygonal shape, a generally circular shape, or a generally elliptical shape.

The display device 10 may include a first area DR1 which is evenly formed and second areas DR2 that extend from lateral sides of the first area DR1. Each of the second areas DR2 may be formed generally flat or formed as a generally curved surface. When the second area DR2 is formed generally flat, an angle between the first area DR1 and the second area DR2 may be an obtuse angle. The second area DR2 may have a predetermined curvature or a varying curvature when formed as the generally curved surface.

In FIG. 1, although an example in which the second areas DR2 extend from the lateral sides of the first area DR1 is described, the exemplary embodiments are not limited thereto. That is, the second area DR2 may extend from only one side among the lateral sides of the first area DR1. Alternatively, the second areas DR2 may extend from one of the vertical sides in addition to the lateral sides of the first area DR1. Hereinafter, an exemplary embodiment in which the second areas DR2 are disposed at lateral edges of the display device 10 will be mainly described.

The cover window 100 may be disposed on the display panel 300 to cover an upper surface of the display panel 300. Accordingly, the cover window 100 may perform a function of protecting the upper surface of the display panel 300.

The cover window 100 may include a transmission part DA100 corresponding to the display panel 300 and a light blocking part NDA100 corresponding to an area except the display panel 300. The cover window 100 may be disposed in the first area DR1 and the second areas DR2. The transmission part DA100 may be disposed in a portion of the first area DR1 and portions of the second areas DR2. The light blocking part NDA100 may be opaquely formed. Alternatively, the light blocking part NDA100 may be formed as a deco layer in which a pattern visible to a user is formed when an image is not displayed.

The display panel 300 may be disposed under the cover window 100. The display panel 300 may be disposed to overlap the transmission part DA100 of the cover window 100. The display panel 300 may be disposed in the first area DR1 and the second areas DR2. Accordingly, an image of the display panel 300 may be visible in not only the first area DR1 but also the second areas DR2.

The display panel 300 may be a light emitting display panel including a light emitting element. For example, the display panel 300 may be an organic light emitting display panel using an organic light emitting diode including an organic light emitting layer, a micro light emitting diode display panel using a micro light emitting diode, and a quantum dot light emitting display panel using a quantum dot light emitting element including a quantum dot light emitting layer, or an inorganic light emitting display panel using an inorganic light emitting element including an inorganic semiconductor. Hereinafter, the display panel 300 is mainly described as an organic light emitting display panel.

The display circuit board 310 and the display driving circuit 320 may be attached to one side of the display panel 300. One end of the display circuit board 310 may be attached onto pads provided at one side of the display panel 300 using an anisotropic conductive film. The display circuit board 310 may be a flexible printed circuit board (FPCB) which is bendable, a rigid printed circuit board (PCB) which is rigid and thus is not bendable, or a composite printed circuit board including both the rigid printed circuit board and the flexible printed circuit board.

The display driving circuit 320 receives control signals and power voltages through the display circuit board 310, and generates and outputs signals and voltages for driving the display panel 300. The display driving circuit 320 may be formed as an integrated circuit (IC) and attached onto the display panel 300 by a chip on glass (COG) method, a chip on plastic (COP) method, or an ultrasonic bonding method, but is not limited thereto. In some exemplary embodiments, the display driving circuit 320 may be attached onto the display circuit board 310. A touch driving circuit 330 and a sound driving part 340 may be disposed on the display circuit board 310.

The touch driving circuit 330 may be formed as an integrated circuit and attached onto an upper surface of the display circuit board 310. The touch driving circuit 330 may be electrically connected to touch electrodes of a touch sensor layer of the display panel 300 through the display circuit board 310. The touch driving circuit 330 may output touch data including touch coordinates of a user by applying touch driving signals to driving electrodes among the touch electrodes, and sensing charge variation amounts of capacitances between the driving electrodes and sensing electrodes through the sensing electrodes among the touch electrodes.

The sound driving part 340 receives first sound data from the main circuit board 700. The sound driving part 340 generates sound signals according to the sound data and outputs the sound signals to the induced magnetic field generation member 510. The sound driving part 340 may be formed as an integrated circuit.

A power supply configured to supply display driving voltages for driving the display driving circuit 320 may be disposed on the display circuit board 310. The display driving voltages and the sound signals may be influenced by each other when generated in one circuit. However, the display driving voltages for driving the display panel 300 and the sound signals for driving the induced magnetic field generation member 510 may be generated in different circuits. Accordingly, it is possible to prevent the display driving voltages and the sound signals from influencing each other.

One side of the flexible film 390 may be attached onto the upper surface of the display panel 300 from the lower side of the display panel 300 using an anisotropic conductive film. The other side of the flexible film 390 may be attached onto the upper surface of the display circuit board 310 from the upper side of the display circuit board 310 using an anisotropic conductive film. The flexible film 390 may be a flexible film which is bendable.

The flexible film 390 may be omitted, and the display circuit board 310 may be directly attached to the one side of the display panel 300. In some exemplary embodiments, the one side of the display panel 300 may be disposed to be bent toward a lower surface of the display panel 300. The display panel 300 may include a layer that may be in the form of a panel lower sheet (400 in FIG. 6), which will be described in further detail below.

The panel lower sheet 400 may include the induced magnetic field generation member 510. For example, the induced magnetic field generation member 510 may be disposed in the panel lower sheet 400. Accordingly, the overall thickness of the sound generator may be reduced, and the overall thickness of the display device 10 may be reduced.

Alternately, the induced magnetic field generation member 510 may be disposed in the display panel 300 instead of the panel lower sheet 400, which may be separate from the display panel as discussed below. A substantially flat member to induce a magnetic field may be in the form of the induced magnetic field generation member 510, which may include a substantially flat coil. Attraction and repulsion may repeatedly occur between the induced magnetic field generation member 510 and the fixed magnetic field generation member 520. Due to the attraction and repulsion, the display device 10, specifically, the display panel 300, may vibrate. Accordingly, the display device 10 may generate sounds using the vibrations.

The bracket 600 may be disposed under the display panel 300. The bracket 600 may include a plastic, a metal, or both a plastic and a metal. In the bracket 600, a first camera hole CMH1 into which a camera device 720 is inserted, a battery hole BH in which a battery 790 is disposed, and a cable hole CAH through which a cable connected to the display circuit board 310 passes may be formed.

The bracket 600 may include the fixed magnetic field generation member 520. The fixed magnetic field generation member 520 may include or be in the form of a magnet. The magnet may have a first polar part and a second polar part having different polarities. For example, the first polar part may be an N-pole, and the second polar part may be an S-pole. As another example, the first polar part may be an S-pole, and the second polar part may be an N-pole. In some exemplary embodiments, the fixed magnetic field generation member 520 may include a plurality of magnets. Each of the magnets may have the first polar part or the second polar part. In the illustrated exemplary embodiment, the magnets each having the first polar part and the magnets each having the second polar part may be alternately disposed.

The main circuit board 700 and the battery 790 may be disposed under the bracket 600. The main circuit board 700 may be a printed circuit board or a flexible printed circuit board.

The main circuit board 700 may include a main processor 710, the camera device 720, a main connector 730, and a memory 740. The main processor 710 may be formed as an integrated circuit.

The camera device 720 may be disposed at both an upper surface and a lower surface of the main circuit board 700, the main processor 710 and the memory 740 may be disposed on the upper surface of the main circuit board 700, and the main connector 730 may be disposed on the lower surface of the main circuit board 700.

The main processor 710 may control all functions of the display device 10. In some exemplary embodiments, the main processor 710 may output digital video data to the display driving circuit 320 through the display circuit board 310 so that the display panel 300 may display an image. Further, the main processor 710 may perform an application indicated by icons displayed at the touch coordinates of the user, after receiving the touch data from the touch driving circuit 330 and determining the touch coordinates of the user.

The main processor 710 receives sound source data from the outside, and outputs the sound source data to the memory 740. Since the memory 740 stores sound data according to a frequency of the sound source data, the memory 740 may output the sound data using the frequency of the sound source data as an input address.

The main processor 710 may be an application processor, a central processing unit, or a system chip formed as an integrated circuit.

The camera device 720 processes an image frame of a still image or video obtained from an image sensor in a camera mode to output the image frame to the main processor 710.

The cable 314 which passes through the cable hole CAH of the bracket 600 may be connected to the main connector 730. Accordingly, the main circuit board 700 may be electrically connected to the display circuit board 310.

The battery 790 may be disposed so as not to overlap the main circuit board 700 in a third direction (the Z-axis direction). The battery 790 may overlap the battery hole BH of the bracket 600.

The lower cover 900 may be disposed under the main circuit board 700 and the battery 790. The lower cover 900 may be fastened and fixed to the bracket 600. The lower cover 900 may form an exterior of a lower surface of the display device 10. The lower cover 900 may include a plastic, a metal, or a combination thereof.

A second camera hole CMH2 at which a lower surface of the camera device 720 is exposed may be formed in the lower cover 900. The position of the camera device 720 and positions of the first and second camera holes CMH1 and CMH2 corresponding to the camera device 720 are not limited to the exemplary embodiment shown in FIG. 2.

The fixed magnetic field generation member 520 and the induced magnetic field generation member 510 may overlap in the thickness direction (the Z-axis direction).

Figure 3:
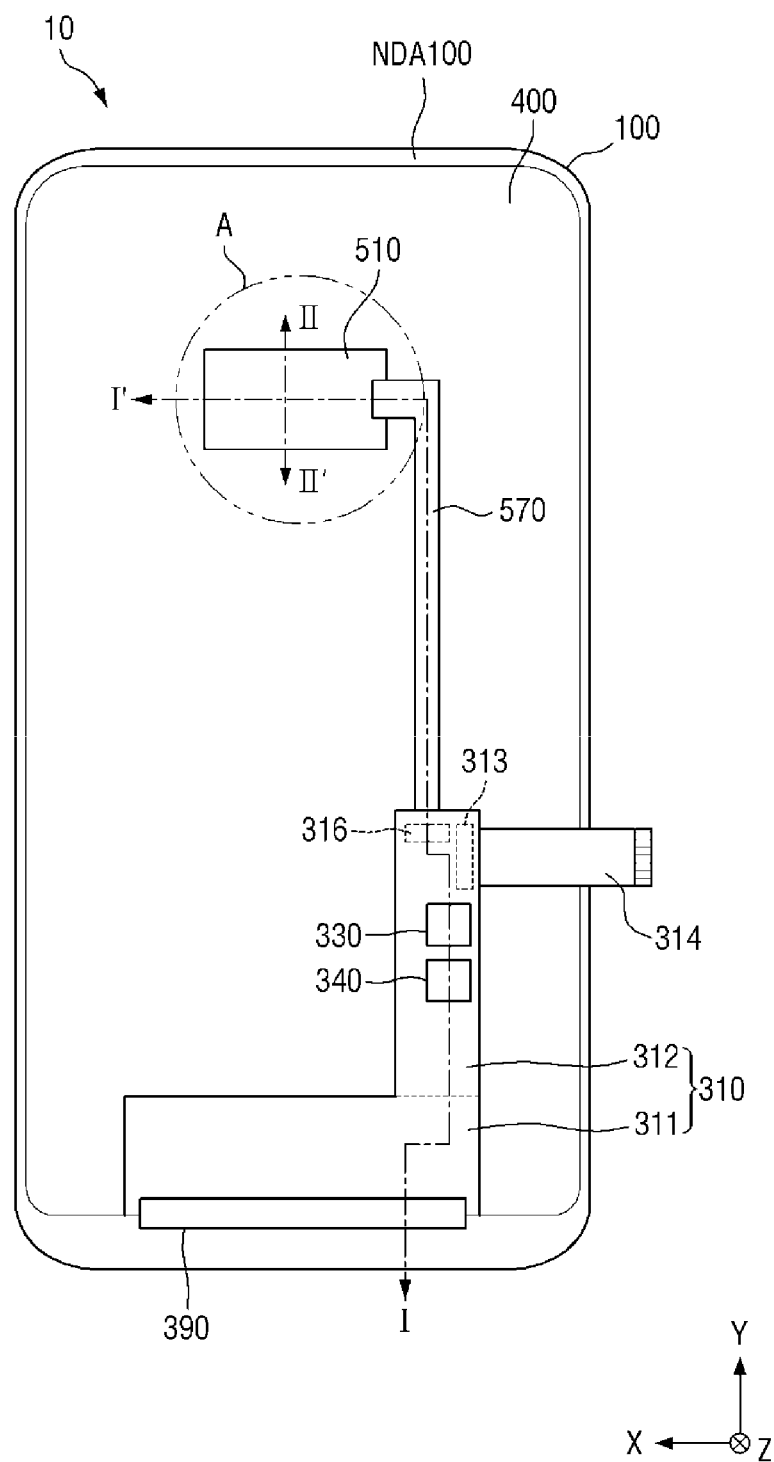
FIG. 3 is a bottom view illustrating the display panel attached to the cover window of FIG. 2.
Figure 4:
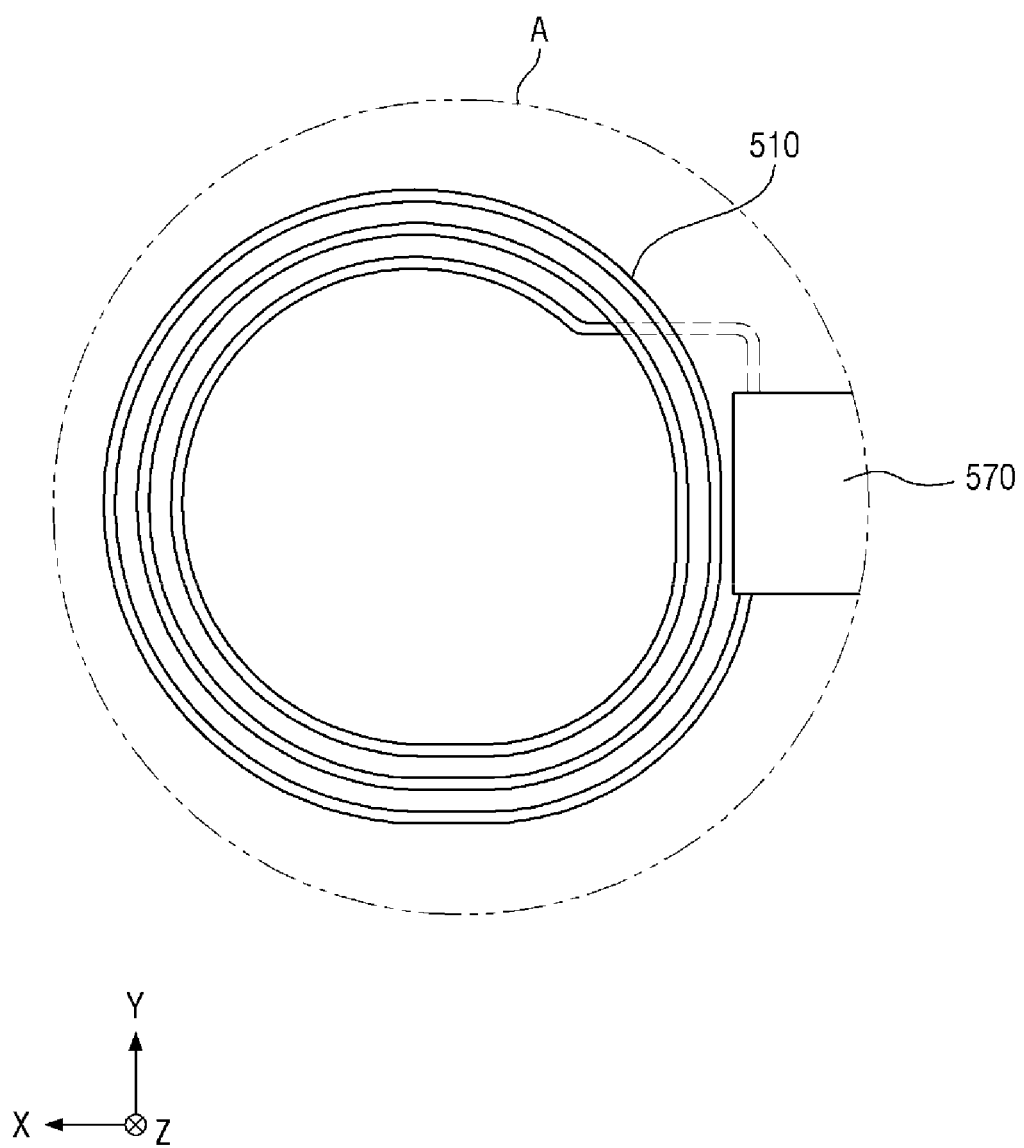
FIG. 4 is an enlarged view of area A of FIG. 3.
Figure 5:
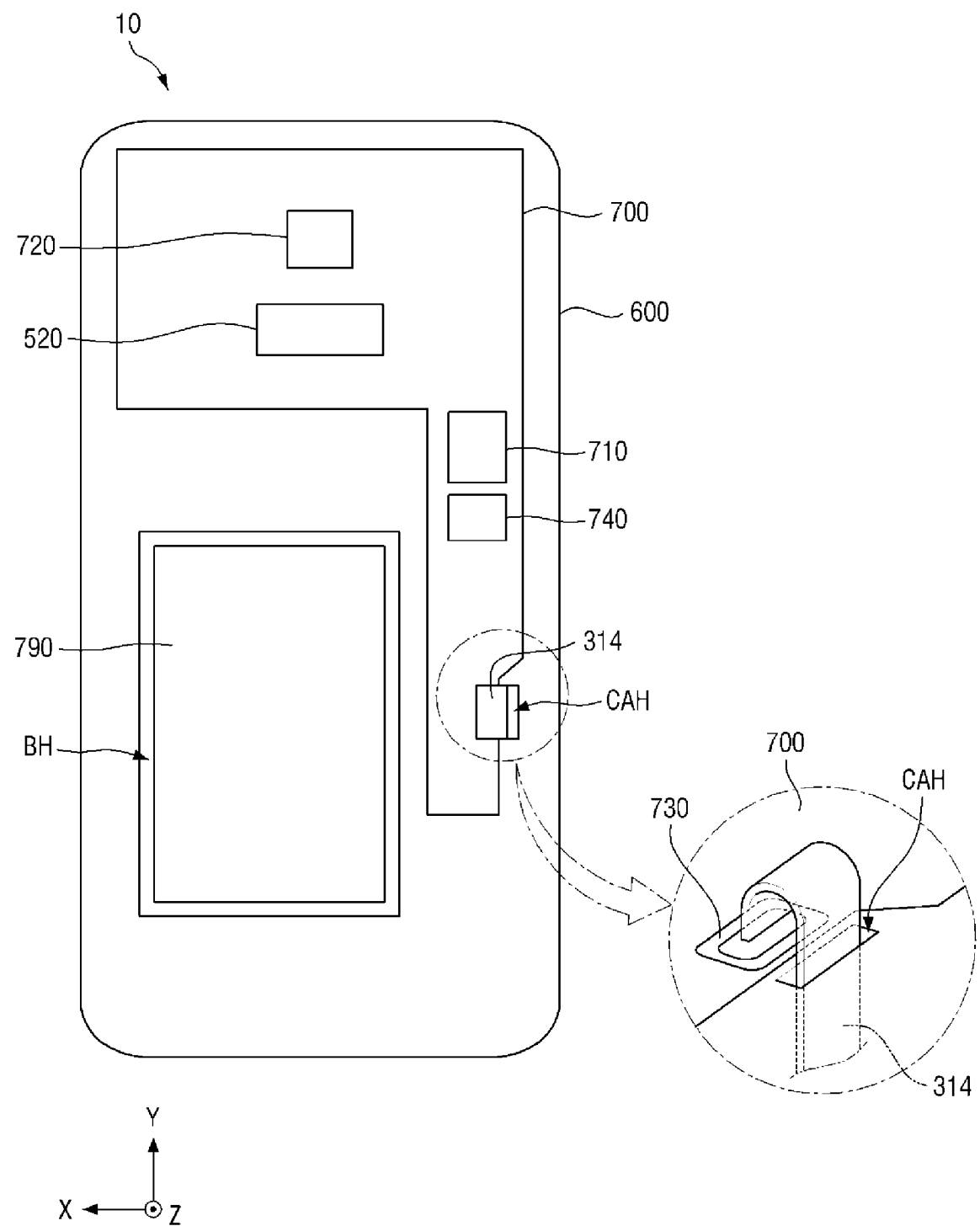
FIG. 5 is a bottom view illustrating an exemplary embodiment of a bracket attached to the lower portion of the display panel of FIG. 3 and the main circuit board disposed on the bracket.

FIG. 3 is a bottom view illustrating the display panel attached to the cover window of FIG. 2. FIG. 4 is an enlarged view of area A of FIG. 3. FIG. 5 is a bottom view illustrating an exemplary embodiment of a bracket attached to the lower portion of the display panel of FIG. 3 and the main circuit board disposed on the bracket.

Referring to FIGS. 3 to 5, the panel lower sheet 400 may be disposed under a substrate (SUB1 in FIG. 6) of the display panel 300. As described above, the panel lower sheet 400 may be included in the display panel 300. However, the exemplary embodiments are not limited thereto, and the panel lower sheet 400 may be understood as a component separate from the display panel 300. In the illustrated exemplary embodiment, the above-described induced magnetic field generation member 510 should be understood to be included in the panel lower sheet 400 separate from the display panel 300.

Figure 6:
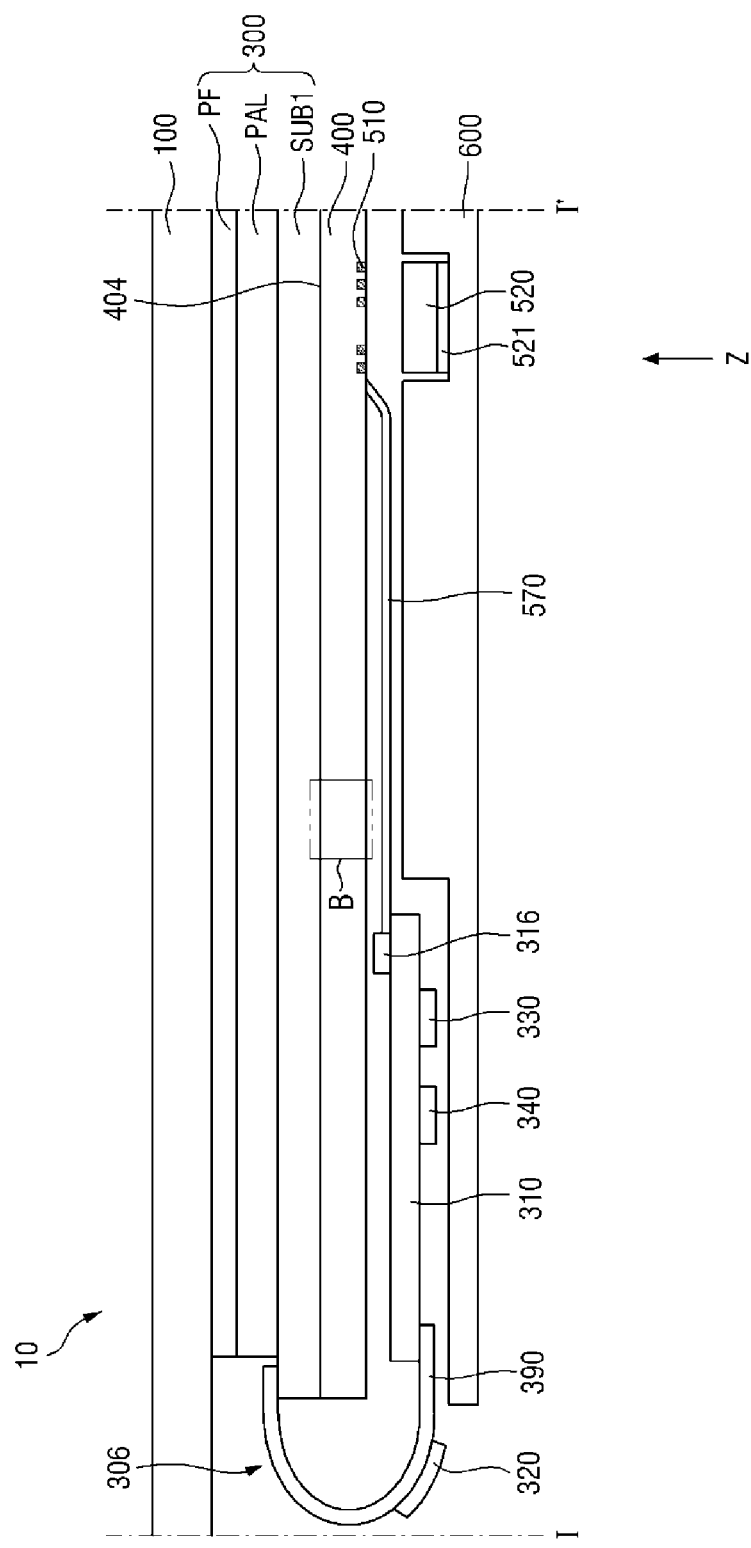
FIG. 6 is a cross-sectional view taken along line I-I' of FIG. 3.

The panel lower sheet 400 may be attached to a lower surface 404 of the substrate SUB1 of the display panel 300 through an adhesive member, as depicted in FIG. 6 discussed in further detail below. The adhesive member may be a pressure sensitive adhesive (PSA).

The panel lower sheet 400 may include at least one of a light absorption member configured to absorb light incident from the outside, a buffer member configured to absorb a shock from the outside, and a heat dissipation member configured to efficiently dissipate heat of the display panel 300.

As shown in FIG. 6, the flexible film 390 attached to one side 306 of the display panel 300 may be bent to be disposed at a lower portion of the panel lower sheet 400. Accordingly, the display circuit board 310 attached to one side of the flexible film 390 may be disposed at the lower portion of the panel lower sheet 400. The display circuit board 310 may be fixed or adhered to a lower surface of the panel lower sheet 400 by a fixing member such as a screw or an adhesive member such as a pressure sensitive adhesive at the lower portion of the panel lower sheet 400.

The display circuit board 310 may include a first circuit board 311 and a second circuit board 312. Each of the first circuit board 311 and the second circuit board 312 may be a rigid printed circuit board or a flexible printed circuit board. When one of the first circuit board 311 and the second circuit board 312 is a rigid printed circuit board, and the other one is a flexible printed circuit board, the display circuit board 310 may be a composite printed circuit board.

As shown in FIG. 3, in some exemplary embodiments, the second circuit board 312 extends from one side of the first circuit board 311 in the second direction (the Y-axis direction). The width of the second circuit board 312 in the first direction (the X-axis direction) may be smaller than the width of the first circuit board 311 in the first direction (the X-axis direction).

The touch driving circuit 330 and the sound driving part 340 may be disposed on one surface of the second circuit board 312, and a first connector 313 and a second connector 316 may be disposed on the other surface of the second circuit board 312. The first connector 313 may include an insertion part connected to a first connection terminal provided at one end of the cable 314. The second connector 316 may include an insertion part connected to a connection terminal provided at one end of a first flexible circuit substrate 570.

The first connection terminal provided at the one end of the cable 314 may be inserted into the insertion part of the first connector 313. As shown in FIG. 5, a second connection terminal provided at the other end of the cable 314 may be bent toward a lower portion of the main circuit board 700 through the cable hole CAH passing through the bracket 600 to be inserted into an insertion part of the main connector 730.

The induced magnetic field generation member 510 may be disposed on the lower surface of the panel lower sheet 400. The induced magnetic field generation member 510 may be attached to the lower surface of the panel lower sheet 400 by a first adhesive member such as a pressure sensitive adhesive. In some exemplary embodiments, the display panel 300 may vibrate in the thickness direction (Z-axis direction) due to the induced magnetic field generation member 510.

The connection terminal formed at the one end of the first flexible circuit substrate 570 may be inserted into the insertion part of the second connector 316. The other end of the first flexible circuit substrate 570 may be connected to the induced magnetic field generation member 510. The first flexible circuit substrate 570 may be a flexible printed circuit board or a flexible printed circuit (FPC).

The bracket 600 may include the battery hole BH, the cable hole CAH, and the first camera hole CMH1. The battery hole BH, the cable hole CAH, and the first camera hole CMH1 may be holes passing through the bracket 600.

Since the battery hole BH is a hole configured to accommodate the battery, as shown in FIG. 5, the battery 790 may overlap the battery hole BH in the third direction (the Z-axis direction). The size of the battery hole BH may be greater than the size of the battery 790.

Since the first camera hole CMH1 of the bracket 600 is a hole configured to accommodate the camera device 720 of the main circuit board 700, the camera device 720 may overlap the first camera hole CMH1 in the third direction (the Z-axis direction).

According to some exemplary embodiments shown in FIGS. 3 and 4, the induced magnetic field generation member 510 may be electrically connected to the display circuit board 310 or the printed circuit board through the first flexible circuit substrate 570. The main circuit board 700 and the display circuit board 310 may be electrically connected through the cable 314.

As shown in FIG. 4, the induced magnetic field generation member 510 electrically connected to the display circuit board 310 through the first flexible circuit substrate 570 may be a substantially flat coil. That is, the induced magnetic field generation member 510 may be an integrally formed coil, and the coils may be disposed in substantially the same plane. Accordingly, the induced magnetic field generation member 510 may have a generally small thickness. Each of the ends of the induced magnetic field generation member 510 may be connected to the first flexible circuit substrate 570 and may have a generally curved shape.

The induced magnetic field generation member 510 may form a curved line from one end of the induced magnetic field generation member 510 with respect to a center point of the induced magnetic field generation member 510. Gradually, the induced magnetic field generation member 510 may have a generally curved shape so that a radius from the center point decreases.

Portions adjacent to the other end of the induced magnetic field generation member 510 may be disposed in another layer unlike the remaining portion of the induced magnetic field generation member 510, to prevent a short circuit with the remaining portion of the induced magnetic field generation member 510.

In FIG. 4, although the illustrated exemplary embodiment has the induced magnetic field generation member 510 with a generally curved shape with respect to the center point, exemplary embodiments are not limited thereto, and the induced magnetic field generation member 510 may consist of a plurality of straight lines that extend in the first direction (the X-axis direction) and the second direction (the Y-axis direction).

FIG. 6 is a cross-sectional view taken along line I-I' of FIG. 3.

Referring to FIG. 6, the display panel 300 may include the substrate SUB1, a pixel array layer PAL, and a polarizing film PF. The substrate SUB1 may be a rigid substrate or a flexible substrate which may be bent, folded, rolled, and the like. The substrate SUB1 may be formed of an insulation material such as a glass, a quartz, and a polymer resin. An example of a polymer material may be a polyethersulfone (PES), a polyacrylate (PA), a polyarylate (PAR), a polyetherimide (PEI), a polyethylene napthalate (PEN), a polyethylene terephthalate (PET), a polyphenylene sulfide (PPS), a polyallylate, a polyimide (PI), a polycarbonate (PC), a cellulose triacetate (CAT), a cellulose acetate propionate (CAP) or a combination thereof. The substrate SUB1 may also include a metal material.

Figure 7:
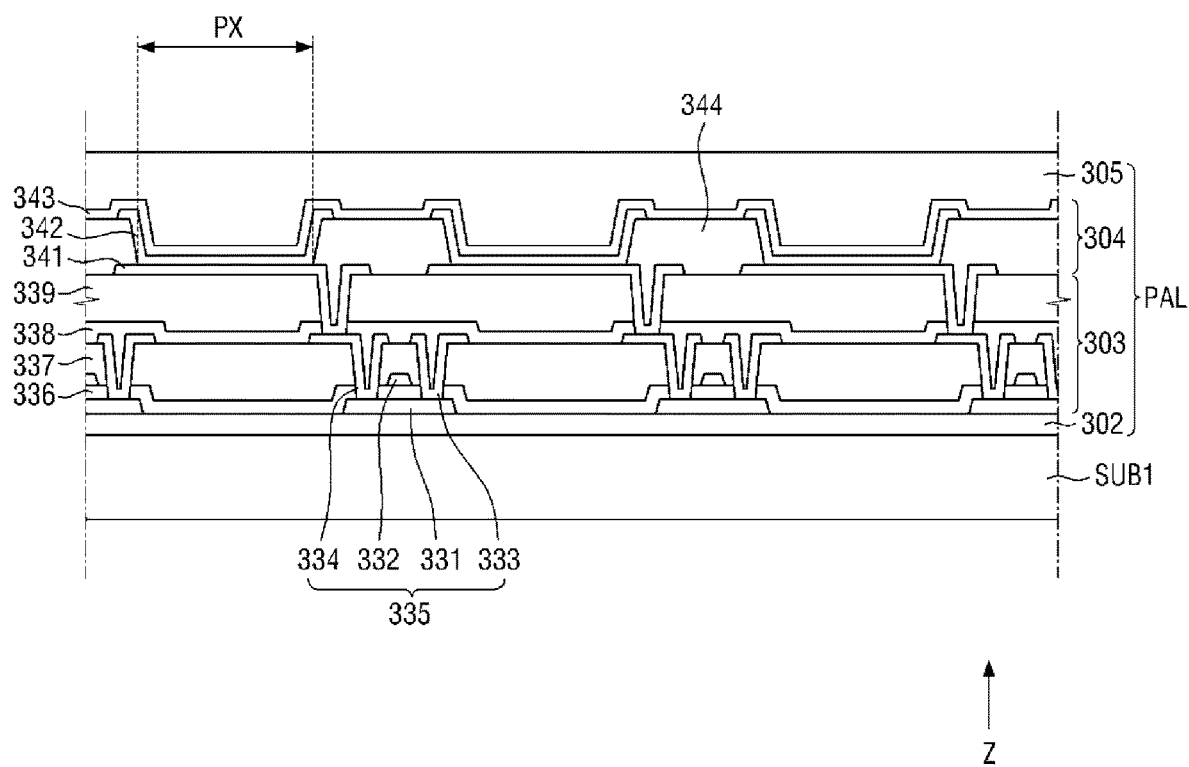
FIG. 7 is a cross-sectional view illustrating an enlarged area of the display panel including the pixel array layer of FIG. 6.

The pixel array layer PAL may be disposed on the substrate SUB1. The pixel array layer PAL may be a layer configured to display an image by including pixels PX. As shown in FIG. 7, the pixel array layer PAL may include a thin film transistor layer 303, a light emitting element layer 304, and a thin film encapsulation layer 305.

The polarizing film PF may be disposed on the pixel array layer PAL to prevent visibility degradation due to reflection of external light. The polarizing film PF may include a phase retardation film such as a linear polarizing plate or a quarter-wave plate. For example, the phase retardation film may be disposed on the pixel array layer PAL, and the linear polarizing plate may be disposed between the phase retardation film and the cover window 100.

The panel lower sheet 400 may be disposed on a first surface of the substrate SUB1 of the display panel 300, and the cover window 100 may be disposed on a second surface opposite the first surface. That is, the cover window 100 may be disposed on an upper surface of the polarizing film PF.

The one side of the flexible film 390 may be attached to one side of the substrate SUB1, and the other side of the flexible film 390 may be attached to one side of the display circuit board 310. The one side of the flexible film 390 may be attached to one surface of the substrate SUB1 using an anisotropic conductive film. The other side of the flexible film 390 may be attached to one surface of the display circuit board 310 using an anisotropic conductive film. The other surface of the display circuit board 310 opposite the one surface of the display circuit board 310 may face the panel lower sheet 400.

In FIG. 6, although an example in which the display driving circuit 320 is disposed on one surface of the flexible film 390 is illustrated, exemplary embodiments are not limited thereto. The display driving circuit 320 may be disposed on the other surface of the flexible film 390 opposite the one surface of the flexible film 390. The other surface of flexible film 390 may be a surface attached to the one surface of the substrate SUB1 and the one surface of the display circuit board 310.

The display circuit board 310 may be disposed on the lower surface of the panel lower sheet 400. The display circuit board 310 may be fixed to the lower surface of the panel lower sheet 400 by a fixing member such as a screw or an adhesive member.

The touch driving circuit 330 and the sound driving part 340 may be disposed on the one surface of the display circuit board 310. The first connector 313 and the second connector 316 may be disposed on the other surface of the display circuit board 310.

The induced magnetic field generation member 510 may be disposed in the panel lower sheet 400. Since the induced magnetic field generation member 510 is disposed in the panel lower sheet 400 to be fixed to the panel lower sheet 400, the display panel 300 may vibrate by a vibration of the induced magnetic field generation member 510. That is, the induced magnetic field generation member 510 may vibrate the display panel 300 to output sound. The induced magnetic field generation member 510 may be electrically connected to the first flexible circuit substrate 570.

The first flexible circuit substrate 570 may be electrically connected to the induced magnetic field generation member 510 through an anisotropic conductive film. Lead lines of the first flexible circuit substrate 570 may be connected to one end and the other end of the induced magnetic field generation member 510. The connection terminal provided at one end of the first flexible circuit substrate 570 may be connected to the lead lines. The connection terminal of the first flexible circuit substrate 570 may be inserted into the insertion part of the second connector 316. The first flexible circuit substrate 570 may be a flexible printed circuit board (FPC) or a flexible film.

Figure 9:
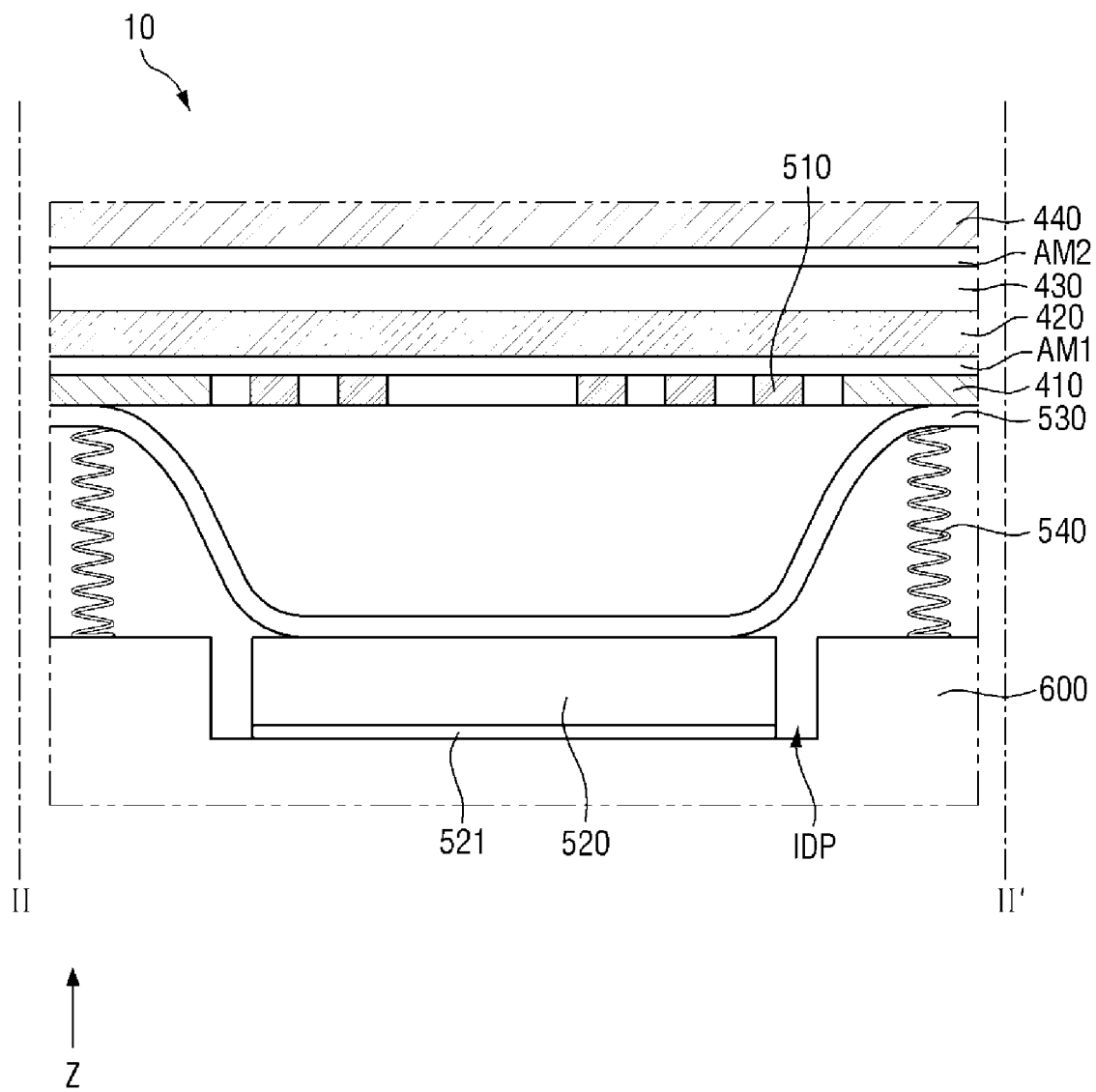
FIG. 9 is a cross-sectional view taken along line II-II' of FIG. 3.
Figure 14:
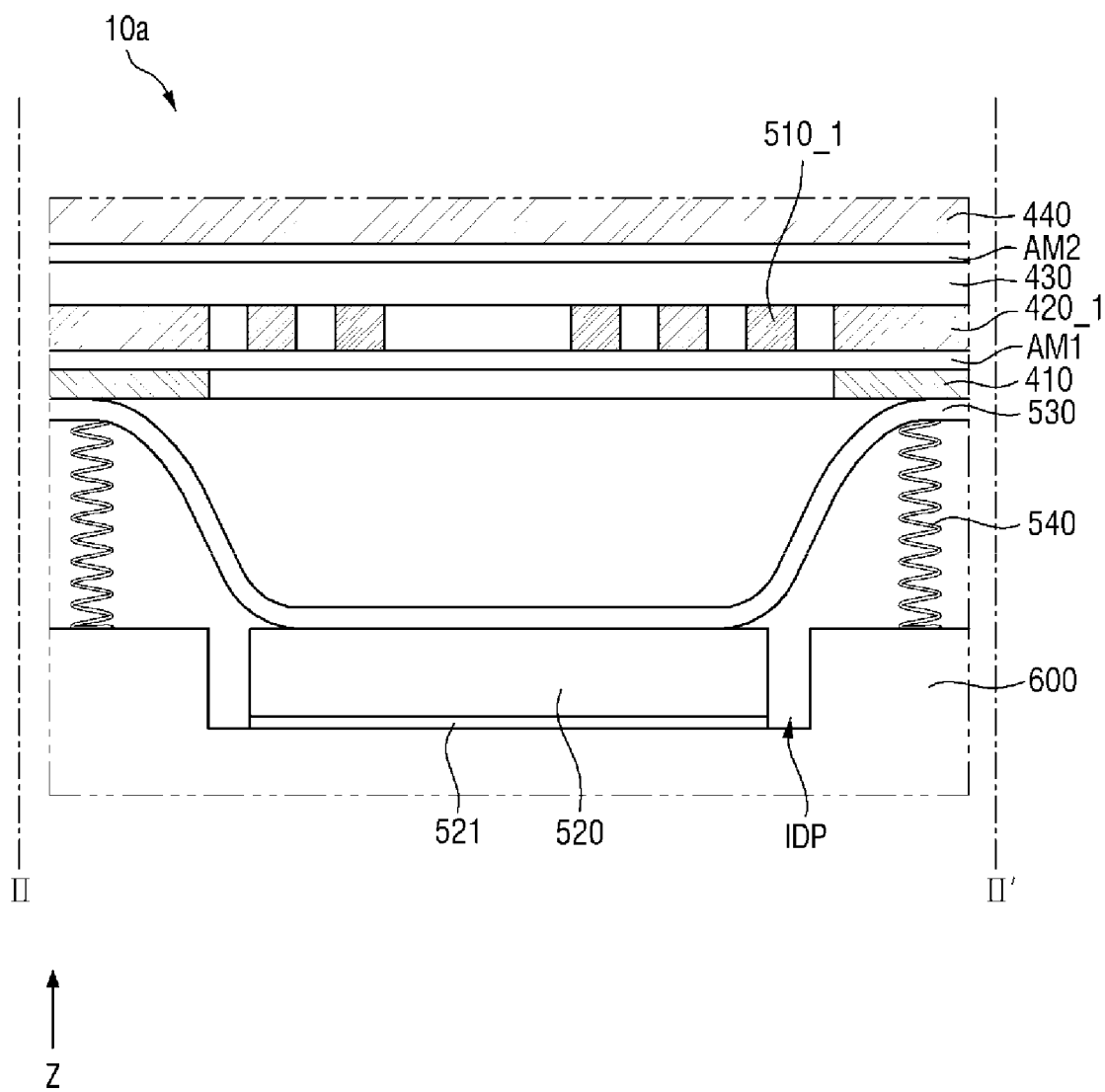
FIG. 14 is a cross-sectional view taken along line II-II' of FIG. 3 of another exemplary embodiment of a display device constructed according to principles of the invention.

The bracket 600 may include an indented part IDP (as indicated in FIGS. 9 and 14) recessed in the thickness direction in an area overlapping the induced magnetic field generation member 510 in the thickness direction. The fixed magnetic field generation member 520 may be disposed in the indented part IDP of the bracket 600. In some exemplary embodiments, the fixed magnetic field generation member 520 may be described as being embedded in the bracket 600.

The fixed magnetic field generation member 520 may be attached to a surface of the indented part IDP of the bracket 600 through an adhesive member 521. The adhesive member 521 may be a pressure sensitive adhesive (PSA).

A sound frame 530, as discussed in further detail below, may be disposed between a bottom surface of the panel lower sheet 400 and the bracket 600. The sound frame 530 may be attached to the bottom surface of the panel lower sheet 400 through an adhesive member. The adhesive member may be a pressure sensitive adhesive. Further, the sound frame 530 may be attached to one surface of the fixed magnetic field generation member 520 through an adhesive member. The adhesive member may also be a pressure sensitive adhesive. The sound frame 530 may have a shape protruding from the bottom surface of the panel lower sheet 400 toward the fixed magnetic field generation member 520. That is, a portion of the sound frame 530 overlapping the fixed magnetic field generation member 520 in the thickness direction may be spaced apart from the bottom surface of the panel lower sheet 400 by a predetermined interval.

A damper, which may be in the form a spring 540 and described in further detail below, may be further disposed between a portion disposed around the indented part IDP of the bracket 600 or a flat part and the bottom surface of the panel lower sheet 400. The spring 540 may serve to dampen vibrations due to the sound generator. The spring 540 may be disposed to be attached to the sound frame 530 and the substantially flat part on the portion disposed around the indented part IDP. The springs 540 may be disposed at one side and the other side of the fixed magnetic field generation member 520.

FIG. 7 is a cross-sectional view illustrating an enlarged area of the display panel including the pixel array layer of FIG. 6.

Referring to FIG. 7, the display panel 300 may include the substrate SUB1 and the pixel array layer PAL. As shown in FIG. 7, the pixel array layer PAL may include a thin film transistor layer 303, a light emitting element layer 304, and a thin film encapsulation layer 305.

A buffer film 302 may be formed on the substrate SUB1. The buffer film 302 may be formed on the substrate SUB1 to protect thin film transistors 335 and light emitting elements from moisture which permeates through the substrate SUB1 vulnerable to moisture permeation. The buffer film 302 may be formed of a plurality of inorganic films which area alternately stacked. For example, the buffer film 302 may be formed as a multilayer in which one or more inorganic films among a silicon oxide film ($SiO_x$), a silicon nitride film ($SiN_x$), and a silicon oxynitride film SiON are alternately stacked. The buffer layer may be omitted.

The thin film transistor layer 303 may be formed on the buffer film 302. The thin film transistor layer 303 includes the thin film transistors 335, a gate insulation film 336, an interlayer insulation film 337, a passivation film 338, and a planarization film 339.

Each of the thin film transistors 335 includes an active layer 331, a gate electrode 332, a source electrode 333, and a drain electrode 334. In FIG. 6, although an example in which the thin film transistor 335 is formed in an upper gate (a top gate) manner in which the gate electrode 332 is located on the active layer 331 in the illustrated exemplary embodiment, exemplary embodiments are not limited thereto. That is, each of the thin film transistors 335 may be formed in a lower gate (a bottom gate) manner in which the gate electrode 332 is located under the active layer 331 or a double gate manner in which the gate electrode 332 is located both on and under the active layer 331.

The active layer 331 is formed on the buffer film 302. The active layer 331 may be formed of a silicon-based semiconductor material or an oxide-based semiconductor material. A light blocking layer configured to block external light incident on the active layer 331 may be formed between the buffer film 302 and the active layer 331.

The gate insulation film 336 may be formed on the active layer 331. The gate insulation film 336 may be formed of an inorganic film, for example, a silicon oxide film (SiOx), a silicon nitride film (SiNx), or a multilayer thereof.

The gate electrode 332 and a gate line may be formed on the gate insulation film 336. The gate electrode 332 and the gate line may be formed as a single layer or multilayer formed of at least one of molybdenum (Mo), aluminum (Al), chromium (Cr), gold (Au), titanium (Ti), nickel (Ni), neodymium (Nd), and copper (Cu) or an alloy thereof.

The interlayer insulation film 337 may be formed on the gate electrode 332 and the gate line. The interlayer insulation film 337 may be formed of an inorganic film, for example, a silicon oxide film ($SiO_x$), a silicon nitride film ($SiN_x$), or a multilayer thereof.

The source electrode 333, the drain electrode 334, and a data line may be formed on the interlayer insulation film 337. Each of the source electrode 333 and the drain electrode 334 may be connected to the active layer 331 through a contact hole passing through the gate insulation film 336 and the interlayer insulation film 337. The source electrode 333, the drain electrode 334, and the data line may be formed as a single layer or multilayer formed of at least one of molybdenum (Mo), aluminum (Al), chromium (Cr), gold (Au), titanium (Ti), nickel (Ni), neodymium (Nd), and copper (Cu) or an alloy thereof.

The passivation film 338 configured to insulate the thin film transistor 335 may be formed on the source electrode 333, the drain electrode 334, and the data line. The passivation film 338 may be formed of an inorganic film, for example, a silicon oxide film (SiOx), a silicon nitride film (SiNx), or a multilayer thereof.

The planarization film 339 configured to planarize a step height due to the thin film transistor 335 may be formed on the passivation film 338. The planarization film 339 may be formed of an organic film of at least one of an acrylic resin, an epoxy resin, a phenolic resin, a polyamide resin, a polyimide resin, or the like.

The light emitting element layer 304 is formed on the thin film transistor layer 303. The light emitting element layer 304 includes the light emitting elements and a pixel definition film 344.

The light emitting elements and the pixel definition film 344 are formed on the planarization film 339. An example in which the light emitting elements are organic light emitting elements including an anode 341, light emitting layers 342, and a cathode 343 is described.

The anode 341 may be formed on the planarization film 339. The anode 341 may be connected to the source electrode 333 of the thin film transistor 335 through a contact hole passing through the passivation film 338 and the planarization film 339.

In order to partition the pixels PX, the pixel definition film 344 may be formed on the planarization film 339 to cover edges of the anode 341. That is, the pixel definition film 344 serves as a pixel defining film configured to define the pixels PX. Each of the pixels PX represents an area in which the anode 341, the light emitting layer 342, and the cathode 343 are sequentially stacked and a hole from the anode 341 and an electron from the cathode 343 are combined in the light emitting layer 342 to emit light.

The light emitting layers 342 are formed on the anode 341 and the pixel definition film 344. The light emitting layers 342 may be organic light emitting layers. The light emitting layer 342 may emit one of red light, green light, and blue light. Alternatively, the light emitting layer 342 may be a white light emitting layer configured to emit white light, and in the illustrated exemplary embodiment, the light emitting layer 342 may have a form in which a red light emitting layer, a green light emitting layer, and a blue light emitting layer are stacked, and may be a common layer commonly formed in each of the pixels PX. In the illustrated exemplary embodiment, the display panel 300 may include separate color filters configured to display a red color, a green color, and a blue color.

The light emitting layer 342 may include a hole transporting layer, a light emitting layer, and an electron transporting layer. Further, the light emitting layer 342 may be formed in a tandem structure of two or more stacks, and in the exemplary embodiment, a charge generation layer may be formed between the stacks.

The cathode 343 is formed on the light emitting layer 342. The second electrode 343 may be formed to cover the light emitting layer 342. The second electrode 343 may be a common layer commonly formed in each of the pixels PX.

When the light emitting element layer 304 is formed in a top emission manner in which light is emitted in an upward direction, the anode 341 may be formed of a metallic material having high reflectivity such as a stacked structure of aluminum and titanium (Ti/Al/Ti), a stacked structure of aluminum and ITO (ITO/Al/ITO), an APC alloy, and a stacked structure of the APC alloy and ITO (ITO/APC/ITO). The APC alloy is an alloy of silver (Ag), palladium (Pd), and copper (Cu). Further, the cathode 343 may be formed of a transparent conductive material (TCO) such as ITO or IZO that can transmit light, or a semi-transmissive conductive material such as magnesium (Mg), silver (Ag), or an alloy of magnesium (Mg) and silver (Ag). When the cathode 343 is formed of the semi-transmissive conductive material, light emission efficiency may be improved by a micro cavity.

When the light emitting element layer 304 is formed in a bottom emission manner in which light is emitted in a downward direction, the anode 341 may be formed of a transparent conductive material (TCO) such as ITO or IZO, or a semi-transmissive conductive material such as magnesium (Mg), silver (Ag), or an alloy of magnesium (Mg) and silver (Ag). The second electrode 343 may be formed of a metallic material having high reflectivity such as a stacked structure of aluminum and titanium (Ti/Al/Ti), a stacked structure of aluminum and ITO (ITO/Al/ITO), an APC alloy, and a stacked structure of the APC alloy and ITO (ITO/APC/ITO). The APC alloy is an alloy of silver (Ag), palladium (Pd), and copper (Cu). The cathode 343 may be formed of a transparent conductive material (TCO) such as ITO or IZO that can transmit light, or a semi-transmissive conductive material such as magnesium (Mg), silver (Ag), or an alloy of magnesium (Mg) and silver (Ag). When the anode 341 is formed of the semi-transmissive conductive material, the light emission efficiency may be improved by a micro cavity.

The thin film encapsulation layer 305 may be formed on the light emitting element layer 304. The thin film encapsulation layer 305 may serve to prevent oxygen or moisture from permeating into the light emitting layer 342 and the cathode 343. To this end, the thin film encapsulation layer 305 may include at least one inorganic film. The inorganic film may be formed of at least one of a silicon nitride, an aluminum nitride, a zirconium nitride, a titanium nitride, a hafnium nitride, a tantalum nitride, a silicon oxide, an aluminum oxide, or a titanium oxide. Further, the thin film encapsulation layer 305 may further include at least one organic film. The organic film may be formed to have the sufficient thickness to prevent foreign matter (particles) from passing through the thin film encapsulation layer 305 and entering the light emitting layer 342 and the cathode 343. The organic film may include at least one of an epoxy, an acrylate, and an urethane acrylate.

A touch sensor layer may be formed on the thin film encapsulation layer 305. The thickness of the display device 10 may be reduced in some exemplary embodiments in which the touch sensor layer is directly formed on the thin film encapsulation layer 305, in comparison with the case in which a separate touch panel is attached onto the thin film encapsulation layer 305.

The touch sensor layer may include touch electrodes configured to sense a touch of a user in a capacitance manner and touch lines configured to connect pads and the touch electrodes. For example, the touch sensor layer may sense the touch of the user in a self-capacitance manner or a mutual capacitance manner.

Figure 8:
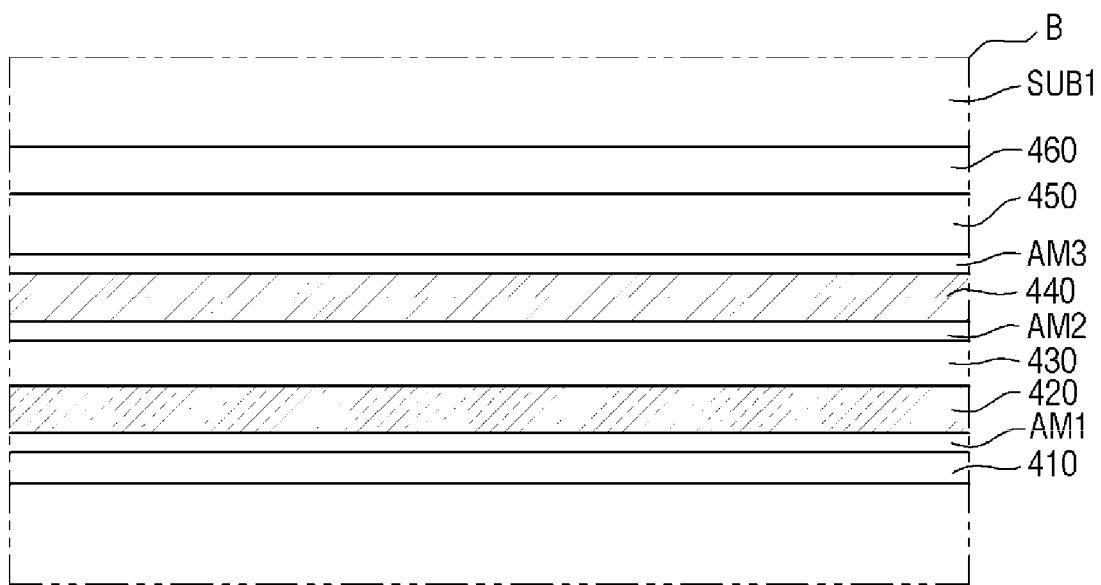
FIG. 8 is an enlarged view of area B of FIG. 6.

FIG. 8 is an enlarged view of area B of FIG. 6. FIG. 9 is a cross-sectional view taken along line II-II' of FIG. 3.

Referring to FIGS. 8 and 9, the panel lower sheet 400 may include a plurality of stacked films or a plurality of members. The panel lower sheet 400 may include a first heat dissipation layer 410, a first adhesive member AM1 disposed on the first heat dissipation layer 410, a second heat dissipation layer 420 disposed on the first adhesive member AM1, a heat dissipation substrate 430 disposed on the second heat dissipation layer 420, a second adhesive member AM2 disposed on the heat dissipation substrate 430, a buffer member 440 disposed on the second adhesive member AM2, a third adhesive member AM3 disposed on the buffer member 440, a buffer substrate 450 disposed on the third adhesive member AM3, and a top coupling layer 460 disposed on the buffer substrate 450.

The first heat dissipation layer 410 may include a metal thin film having high heat conductivity such as at least of one of copper, nickel, ferrite, or silver.

The second heat dissipation layer 420 may include at least one of a graphite, a carbon nanotube, or the like. The second heat dissipation layer 420 may be an electromagnetic shielding layer.

The first adhesive member AM1 may be disposed between the first heat dissipation layer 410 and the second heat dissipation layer 420 to serve to couple the first heat dissipation layer 410 and the second heat dissipation layer 420. The first adhesive member AM1 may include a pressure sensitive adhesive.

The heat dissipation substrate 430 may include a polyimide or the like, and may serve to support the first heat dissipation layer 410 and the second heat dissipation layer 420 thereunder. In some exemplary embodiments, the heat dissipation substrate 430 may be omitted. In the illustrated exemplary embodiment, the second heat dissipation layer 420 may directly come into contact with the second adhesive member AM2, and may be directly coupled to the buffer member 440 through the second adhesive member AM2.

The buffer member 440 may be disposed on the heat dissipation substrate 430. The buffer member 440 may absorb external shocks to prevent damage to the display panel 300. The buffer member 440 may be a single layer or multilayer. For example, the buffer member 440 may be formed of a polymer resin such as at least one of a polyurethane, a polycarbonate, a polypropylene, a polyethylene, or the like or an elastic material such as at least one of a rubber, a urethane-based material, a sponge in which an acrylic material is foam-molded, or the like. The buffer member 440 may be a cushion layer.

The second adhesive member AM2 may be disposed between the buffer member 440 and the heat dissipation substrate 430. In other words, the second adhesive member AM2 may serve to couple the buffer member 440 and the heat dissipation substrate 430. The second adhesive member AM2 may include a pressure sensitive adhesive.

The buffer substrate 450 may be disposed on the buffer member 440. The buffer substrate 450 may include a polyimide or the like, and may serve to support the buffer member 440 thereunder. In some exemplary embodiments, the buffer substrate 450 may be omitted.

The third adhesive member AM3 may be disposed between the buffer substrate 450 and the buffer member 440, to couple the buffer substrate 450 and the buffer member 440. The third adhesive member AM3 may include a pressure sensitive adhesive. When the buffer substrate 450 is omitted, the third adhesive member AM3 may be omitted, and in this case, the buffer member 440 may directly come into contact with the top coupling layer 460 to be attached to the substrate SUB1.

The top coupling layer 460 may be disposed between the buffer substrate 450 and the substrate SUB1, to couple the buffer substrate 450 and the substrate SUB1. The top coupling layer 460 may include a pressure sensitive adhesive.

A light absorption member may be further disposed between the buffer substrate 450 and the top coupling layer 460. The light absorption member may block the transmission of light to prevent recognition of components disposed under the light absorption member, for example, the display circuit board 310, the induced magnetic field generation member 510, and the like from above the display panel 300. The light absorption member may include a light absorption material such as a black pigment, a dye, or the like.

The induced magnetic field generation member 510 may be disposed in the panel lower sheet 400. The induced magnetic field generation member 510 may be disposed on the same layer as one of a plurality of films of the panel lower sheet 400 or one of a plurality of members of the panel lower sheet 400. As shown in FIG. 9, the induced magnetic field generation member 510 and the first heat dissipation layer 410 may be disposed on the same layer. In the panel lower sheet 400, an area in which the induced magnetic field generation member 510 is disposed in the thickness direction is referred to as a first area, and an area in which the induced magnetic field generation member 510 is not disposed is referred to as a second area. The first heat dissipation layer 410 may not be disposed in the first area in which the induced magnetic field generation member 510 is disposed. The first heat dissipation layer 410 may be spaced apart and electrically insulated from the induced magnetic field generation member 510. An insulation member may be further disposed around the induced magnetic field generation member 510. The insulation member may include an organic material. The insulation member may be disposed between the magnetic field generation member 510 and the first heat dissipation layer 410, to prevent an electrical short circuit between the first heat dissipation layer 410 and the induced magnetic field generation member 510.

Unlike the first heat dissipation layer 410, the second heat dissipation layer 420 may be disposed in both the first area and the second area.

In some exemplary embodiments, the heat dissipation member 440 may be removed from the first area. That is, the heat dissipation member 440 may not be disposed in the first area, and, a decrease in vibrations of the sound generator due to the heat dissipation member 440 may be prevented.

In some exemplary embodiments, the second heat dissipation layer 420 may be removed from the first area. That is, second heat dissipation layer 420 may not be disposed in the first area, and the second heat dissipation layer 420 may be prevented from being broken by the vibrations of the sound generator.

In the display device 10 according to some exemplary embodiments, because the induced magnetic field generation member 510 is configured as a substantially flat coil, the overall thickness of the sound generator may be reduced. In addition, because the induced magnetic field generation member 510 is disposed in the panel lower sheet 400, without being formed as a component separate from the panel lower sheet 400 and is attached to the lower surface of the panel lower sheet 400, the overall thickness of the sound generator may be further reduced, and accordingly, the overall thickness of the display device may also be reduced.

Figure 10:
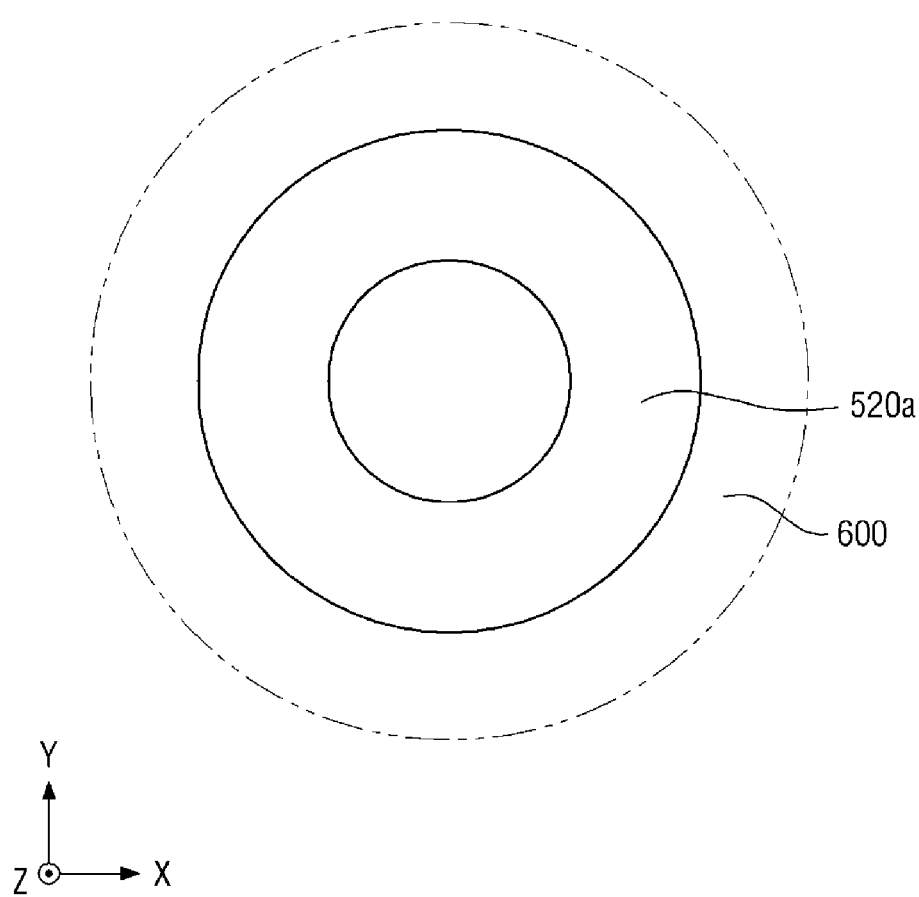
FIG. 10 is a plan view of an exemplary embodiment of a fixed magnetic field generation member constructed according to principles of the invention.
Figure 11:
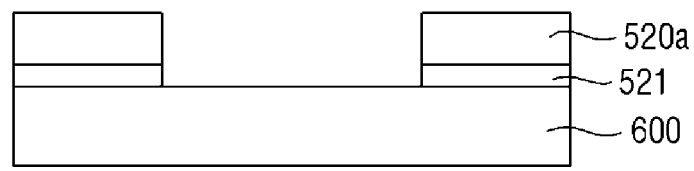
FIG. 11 is a cross-sectional view of the fixed magnetic field generation member of FIG. 10.

FIG. 10 is a plan view of an exemplary embodiment of a fixed magnetic field generation member constructed according to principles of the invention. FIG. 11 is a cross-sectional view of the fixed magnetic field generation member of FIG. 10.

Referring to FIGS. 10 and 11, a fixed magnetic field member 520a according to another illustrated exemplary embodiment may have a generally circular shape, and may have a generally annular (ring) shape in which a center portion of a circle is open. An adhesive member 521 is substantially the same as the generally planar shape of the generally ring-shaped fixed magnetic field member 520a, and may have the same size as that of the fixed magnetic field member 520a in a plan view. The generally ring shape of the fixed magnetic field member 520a may include an inner circumferential surface and an outer circumferential surface. The inner side of the inner circumferential surface of the fixed magnetic field member 520a may be exposed to expose a bracket 600, and the outer side of the outer circumferential surface of the fixed magnetic field member 520a may also be exposed to expose the bracket 600.

In some exemplary embodiments, the generally planar shape and the size of the fixed magnetic field member 520a may be freely adjusted to adjust a magnetic field direction with an induced magnetic field member 510 is illustrated.

Figure 12:
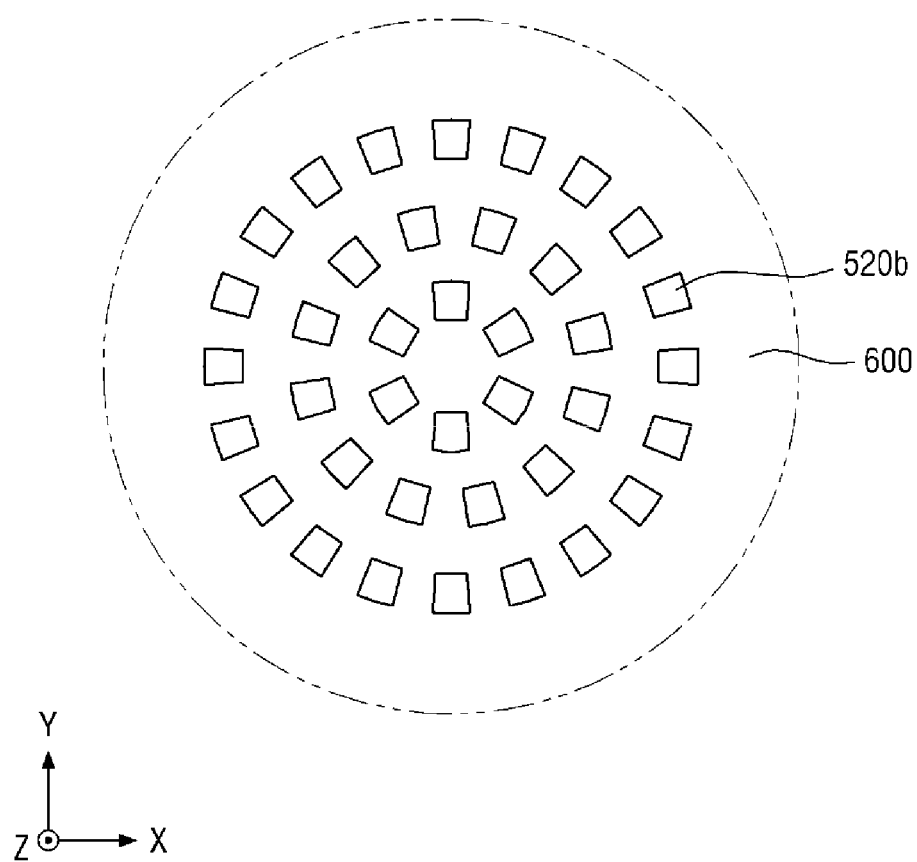
FIGS. 12 and 13 are plan views of other exemplary embodiments of fixed magnetic field generation members.
Figure 13:
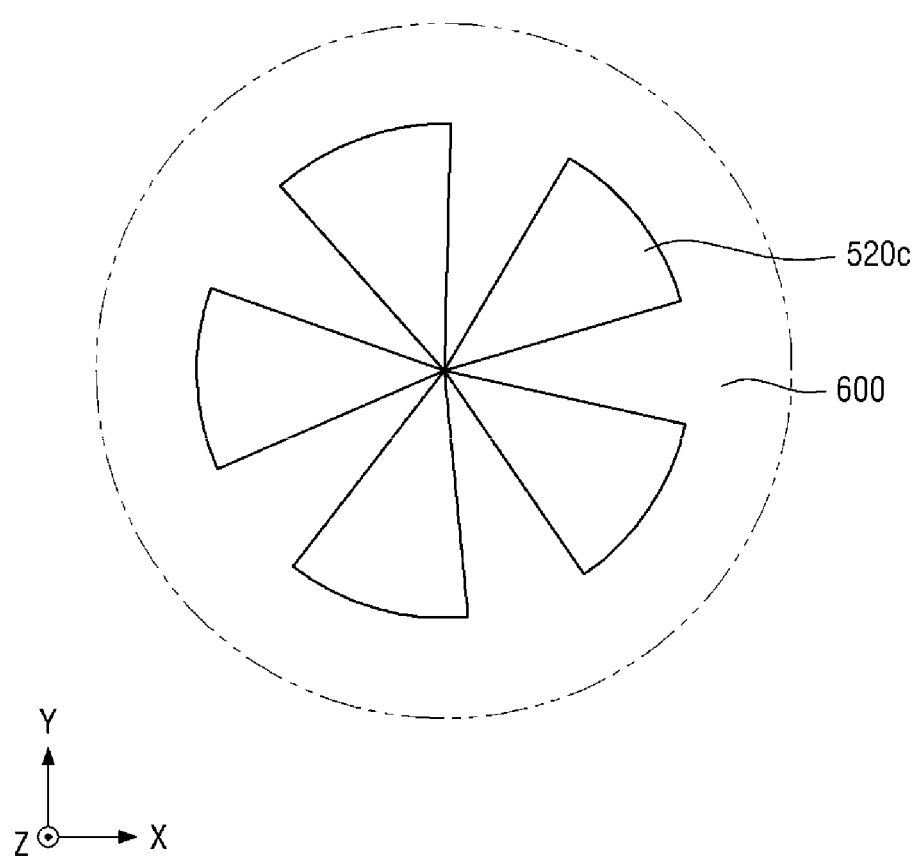

FIGS. 12 and 13 are plan views of other exemplary embodiments of fixed magnetic field generation members.

Referring to FIG. 12, a fixed magnetic field generation member 520b according to a modified example may include a plurality of patterns, and the plurality of patterns may be arranged along an outer circumferential direction of a circle to form a generally circular shape. Further, the fixed magnetic field generation member 520b according to some exemplary embodiments may include a plurality of generally circular shapes having different radii. In the illustrated exemplary embodiment, although three generally circular shapes having different radii are illustrated, the number of generally circular shapes is not limited thereto, and may be one, two, or four or more.

Each of the patterns may have a generally rectangular shape or a generally trapezoidal shape. However, the exemplary embodiments are not limited thereto, and each of the patterns may have a generally rhombical shape, another generally polygonal shape, a generally circular shape, or a generally elliptical shape. The patterns may be disposed to be physically spaced apart from each other.

In some exemplary embodiments, the generally planar shape and size of the fixed magnetic field generation member 520b may be freely adjusted to adjust the magnetic field direction with the induced magnetic field member 510.

Referring to FIG. 13, a fixed magnetic field generation member 520c according to some exemplary embodiments may include a plurality of patterns, and the plurality of patterns may be arranged along a circumferential direction of a circle to form a generally circular shape. In the illustrated exemplary embodiment, five generally triangular shapes may constitute the magnetic field generation member 520c in a plan view, but any suitable number of shapes may be used. The patterns may be disposed not to be physically spaced apart from each other and to physically come into contact with each other In the illustrated exemplary embodiment, the generally planar shape and size of the fixed magnetic field generation member 520c may be freely adjusted to adjust a magnetic field direction with the induced magnetic field member 510.

Hereinafter, other exemplary embodiments will be described. In the following exemplary embodiments, components the same as those in the above-described exemplary embodiments will be omitted or simplified to avoid redundancy, and differences will be mainly described FIG. 14 is a cross-sectional view taken along line II-II' of FIG. 3 of another exemplary embodiment of a display device constructed according to principles of the invention.

Referring to FIG. 14, the display device 10a according to the illustrated exemplary embodiment is different from the illustrated exemplary embodiment according to FIG. 9 in that an induced magnetic field generation member 510_1 is disposed on the same layer as a second heat dissipation layer 420_1.

More specifically, in the display device 10a according to the illustrated exemplary embodiment, the induced magnetic field generation member 510_1 may be disposed on the same layer as the second heat dissipation layer 420_1. The second heat dissipation layer 420_1 may be removed from the first area and may not be disposed in the first area of the panel lower sheet 410. The induced magnetic field generation member 510_1 may be electrically insulated from the second heat dissipation layer 420_1 by being spaced apart from the second heat dissipation layer 420_1. An insulation member may be further disposed around the induced magnetic field generation member 510_1. The insulation member may include an organic material. The insulation member may be disposed between the induced magnetic field generation member 510_1 and the second heat dissipation layer 420_1, to prevent an electrical short circuit between the second heat dissipation layer 420_1 and the induced magnetic field generation member 510_1.

Figure 15:
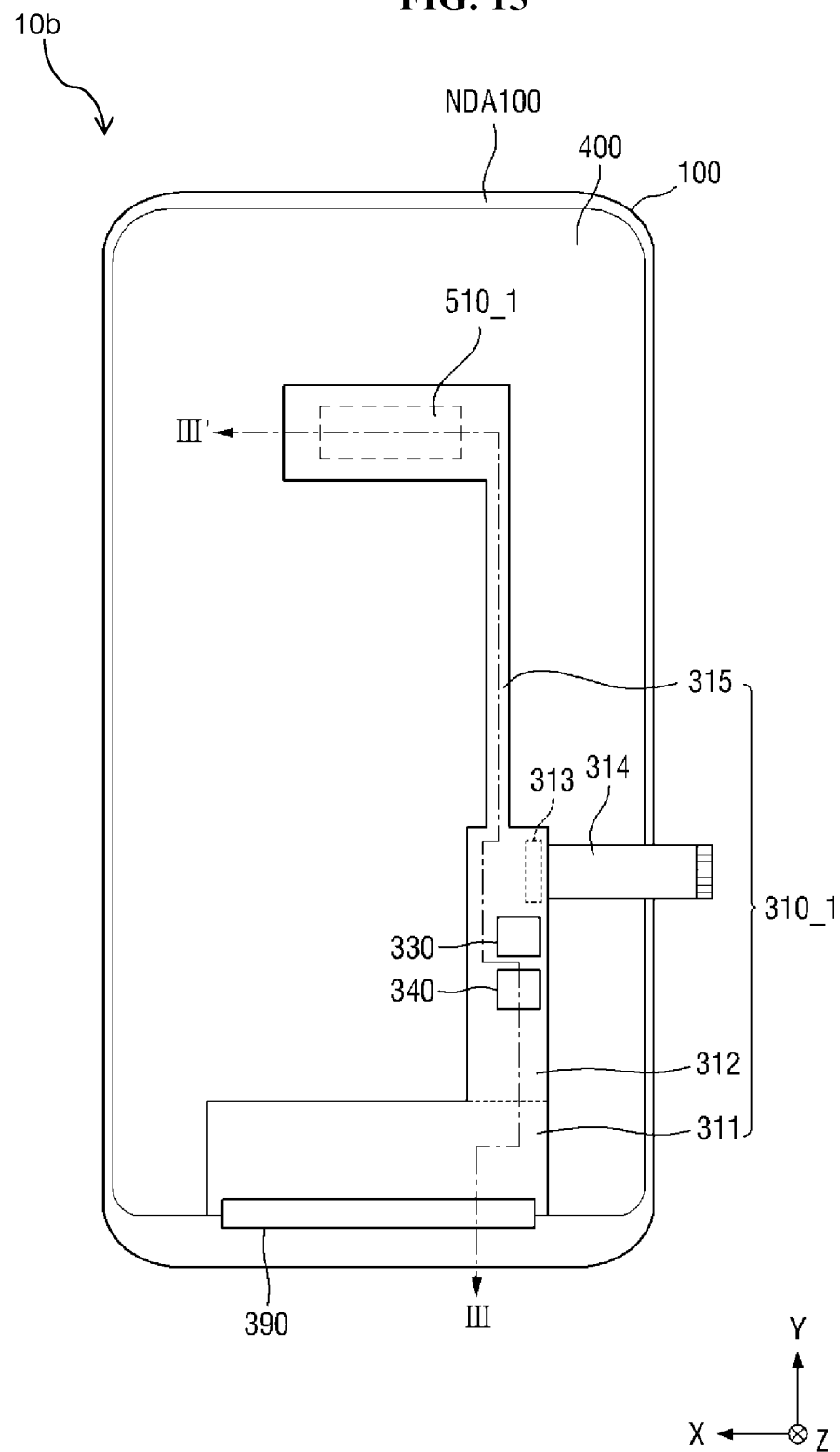
FIG. 15 is a bottom view of another exemplary embodiment of a display panel attached to the cover window of FIG. 2.
Figure 16:
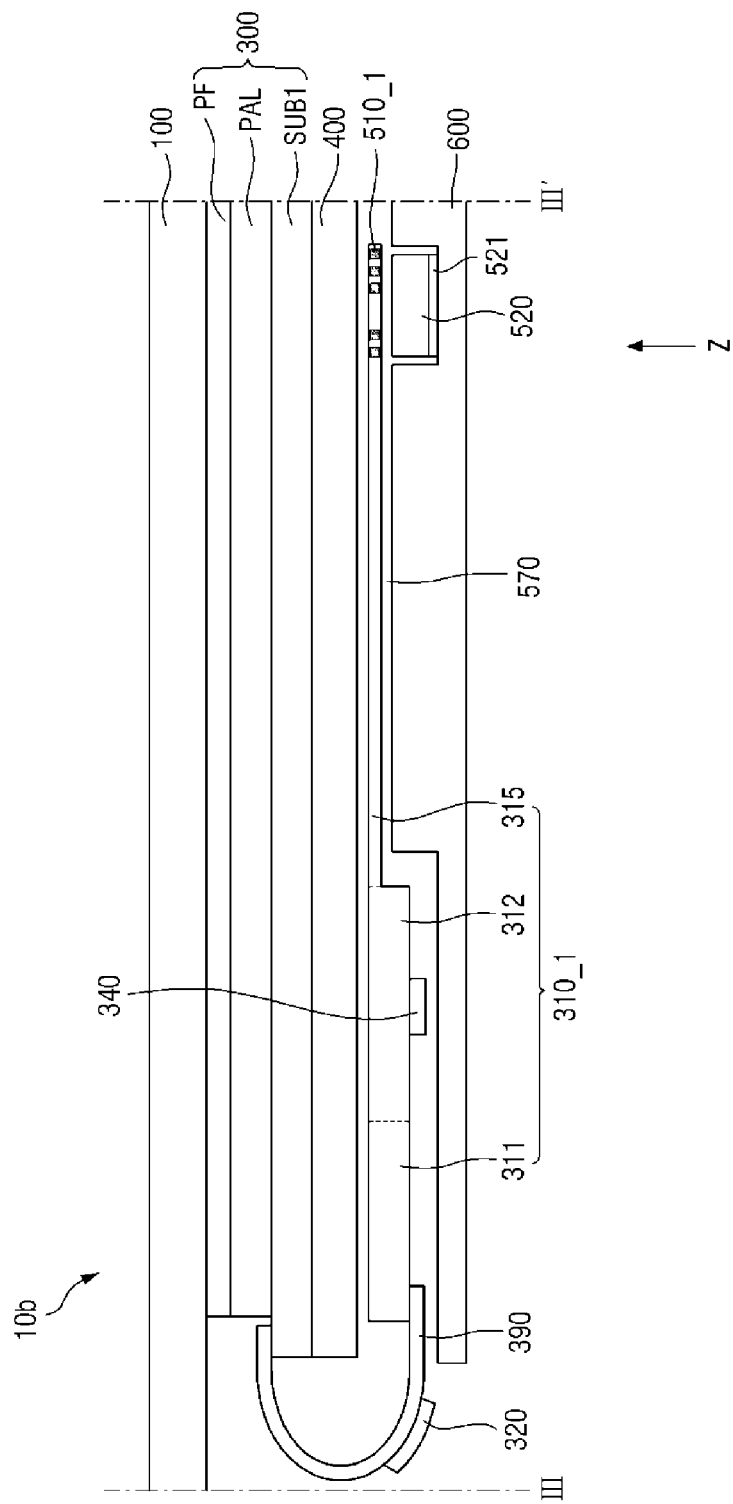
FIG. 16 is a cross-sectional view of an exemplary embodiment of the display panel taken along line of FIG. 15.

FIG. 15 is a bottom view of another exemplary embodiment of a display panel attached to the cover window of FIG. 2. FIG. 16 is a cross-sectional view of an exemplary embodiment of the display panel taken along line of FIG. 15.

Referring to FIGS. 15 and 16, the display device 10b according to the embodiment is different from the illustrated exemplary embodiment according to FIGS. 3 and 6 in that a display circuit board 310_1 further includes a third circuit board 315, and the induced magnetic field generation member 510_1 is disposed to overlap the third circuit board 315 in the thickness direction.

More specifically, in the display device 10b, the display circuit board 310_1 may further include the third circuit board 315, and the induced magnetic field generation member 510_1 may be disposed to overlap the third circuit board 315 in the thickness direction. The third circuit board 315 may be physically connected to the second circuit board 312.

The induced magnetic field generation member 510_1 may be disposed in the display circuit board 310_1. The induced magnetic field generation member 510_1 may be disposed in the third circuit board 315 of the display circuit board 310_1.

In the display device 10b according to the illustrated exemplary embodiment, since the induced magnetic field generation member 510_1 is disposed in a form of being embedded in the display circuit board 310_1 and thus is not formed as a component separate from the panel lower sheet 400, which is attached to a lower surface of the panel lower sheet 400 or the like, the overall thickness of the sound generator may be further reduced. Accordingly, the overall thickness of the display device 10b may also be reduced.

Figure 17:
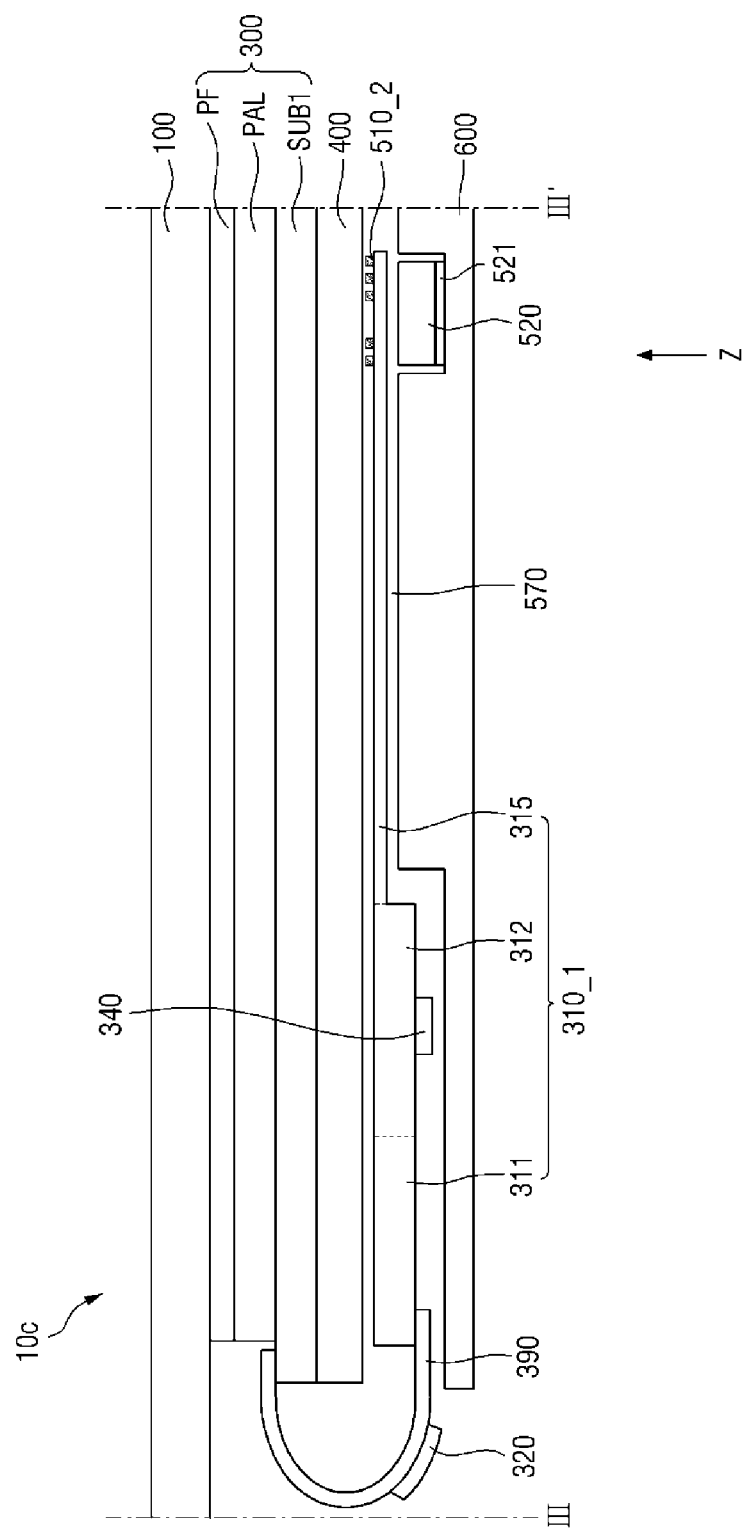
FIG. 17 is a cross-sectional view of another exemplary embodiment of the display panel taken along line of FIG. 15.

FIG. 17 is a cross-sectional view of another exemplary embodiment of the display panel taken along line of FIG. 15.

Referring to FIG. 17, a display device 10c according to the illustrated exemplary embodiment is different from the illustrated exemplary embodiment according to FIG. 16 in that an induced magnetic field generation member 510_2 is disposed between the third circuit board 315 of the display circuit board 310_1 and the panel lower sheet 400.

More specifically, in the display device 10c according to the exemplary embodiment, the induced magnetic field generation member 510_2 may be disposed between the third circuit board 315 of the display circuit board 310_1 and the panel lower sheet 400. The induced magnetic field generation member 510_2 may be attached onto one surface of the third circuit board 315 facing the panel lower sheet 400.

In the display device 10c according to the illustrated exemplary embodiment, because the induced magnetic field generation member 510_2 is attached to the display circuit board 310_1 and disposed between the display circuit board 310_1 and the panel lower sheet 400, the induced magnetic field generation member 510_2 is not formed as a component separate from the panel lower sheet 400. As the induced magnetic field generation member 510_2 is attached to a lower surface of the panel lower sheet 400 or the like, the overall thickness of the sound generator may be reduced. Accordingly, the overall thickness of the display device may also be reduced.

Figure 18:
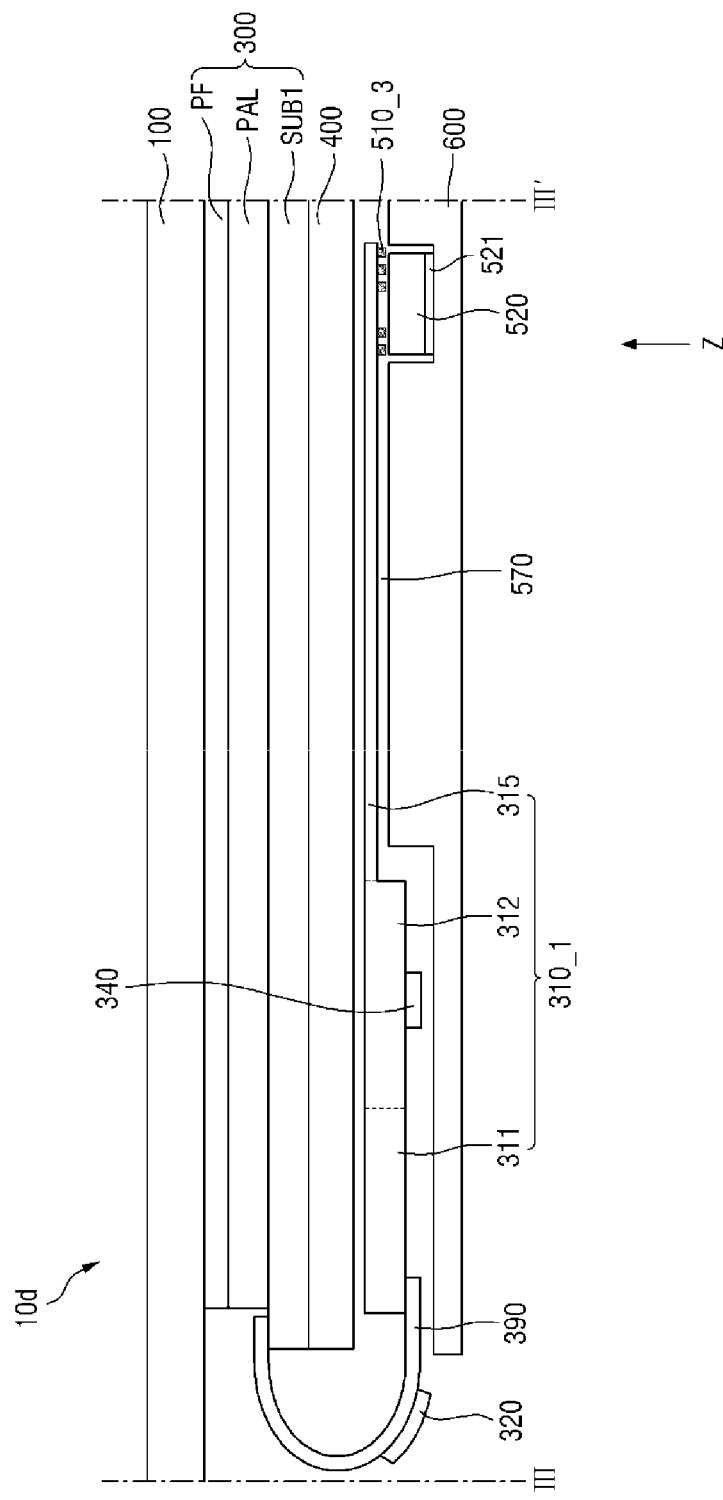
FIG. 18 is a cross-sectional view of a further exemplary embodiment of the display panel taken along line of FIG. 15.

FIG. 18 is a cross-sectional view of a further exemplary embodiment of the display panel taken along line of FIG. 15.

Referring to FIG. 18, a display device 10d according to the illustrated exemplary embodiment is different from the illustrated exemplary embodiment according to FIG. 17 in that an induced magnetic field generation member 510_3 is disposed between the third circuit board 315 of the display circuit board 310_1 and the fixed magnetic field generation member 520.

More specifically, in the display device 10d according to the illustrated exemplary embodiment, the induced magnetic field generation member 510_3 may be disposed between the third circuit board 315 of the display circuit board 310_1 and the fixed magnetic field generation member 520. The induced magnetic field generation member 510_3 may be attached onto one surface of the third circuit board 315 facing the fixed magnetic field generation member 520.

In the display device 10d according to the illustrated exemplary embodiment, the induced magnetic field generation member 510_3 is disposed between the display circuit board 310_1 and the fixed magnetic field generation member 520. The fixed magnetic field generation member 520 is attached to the display circuit board 310_1, and is not formed as a component separate from a panel lower sheet 400, but is instead attached to a lower surface of the panel lower sheet 400 or the like, and thus the overall thickness of the sound generator may be reduced. Accordingly, the overall thickness of the display device may also be reduced.

Figure 19:
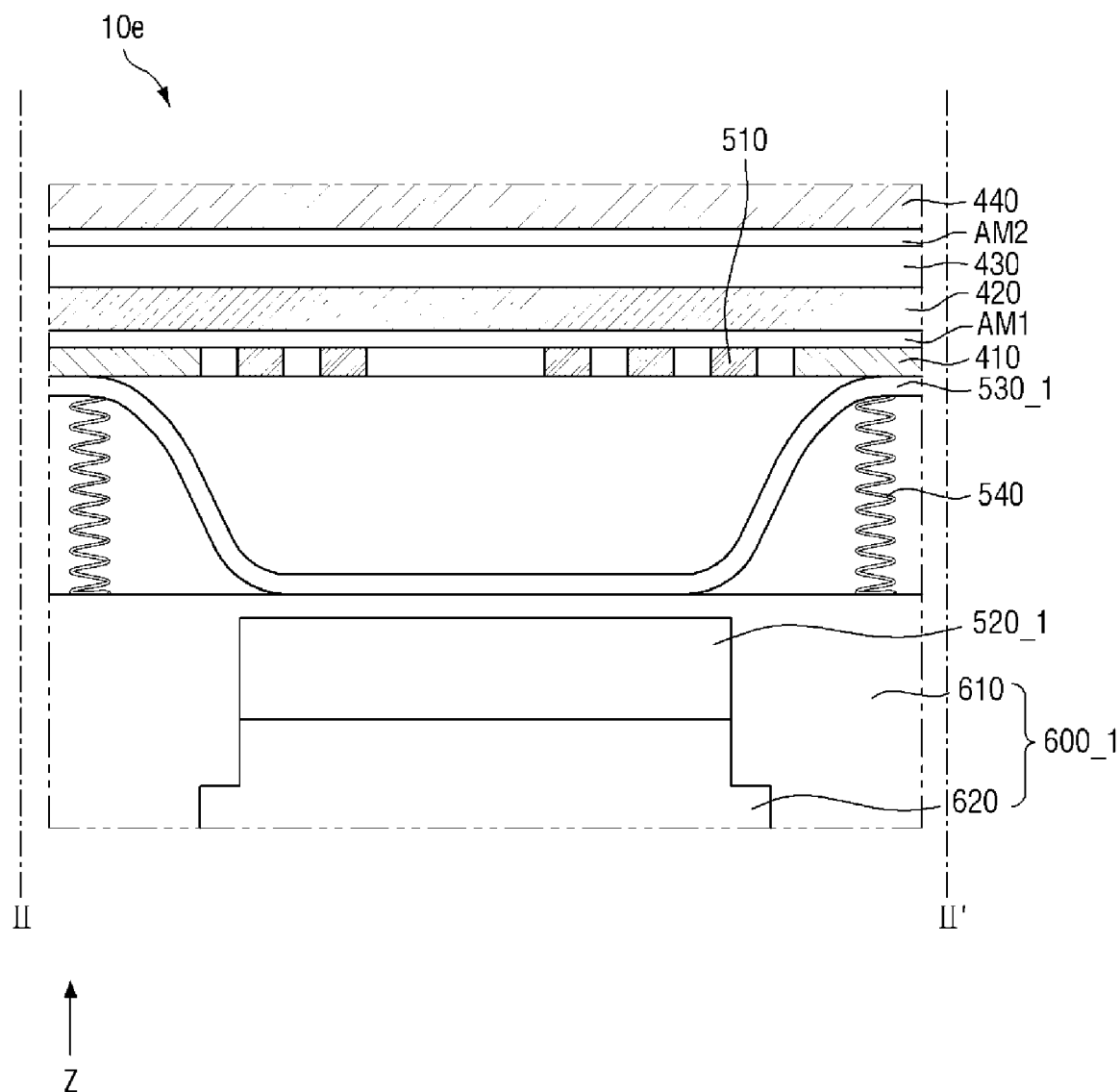
FIG. 19 is a cross-sectional view taken along line II-II' of FIG. 3 of another exemplary embodiment of the display device.

FIG. 19 is a cross-sectional view taken along line II-II' of FIG. 3 of another exemplary embodiment of the display device.

Referring to FIG. 19, the display device 10e according to the illustrated exemplary embodiment is different from the illustrated exemplary embodiment according to FIG. 6 in that a fixed magnetic field generation member 520_1 is disposed in a bracket 600_1.

More specifically, in the display device 10e according to the illustrated exemplary embodiment, the fixed magnetic field generation member 520_1 may be disposed in the bracket 600_1. Further, since the fixed magnetic field generation member 520_1 is disposed in the bracket 600_1, a sound frame 530_1 may be attached onto one surface of the bracket 600_1 facing a panel lower sheet 400.

As shown in FIG. 19, the bracket 600_1 may include a first bracket area 610 or a first bracket part 610 that surrounds side surfaces and an upper surface (one surface facing a panel lower sheet) of the fixed magnetic field generation member 520_1, and a second bracket area 620 or a second bracket part 620 that surrounds a lower surface of the fixed magnetic field generation member 520_1 opposite the upper surface of the fixed magnetic field generation member 520_1.

The fixed magnetic field generation member 520_1 may be received in an inner accommodation space of the first bracket area 610. Further, the fixed magnetic field generation member 520_1 may be received in the bracket 600_1 in the manner of the second bracket area 620 being inserted onto a lower surface of the fixed magnetic field generation member 520_1 and onto the first bracket area 610.

In the display device 10e according to the illustrated exemplary embodiment, since the fixed magnetic field generation member 520_1 is accommodated in the bracket 600_1, the overall thickness of the sound generator may be reduced. Accordingly, the overall thickness of the display device may also be reduced.

Figure 20:
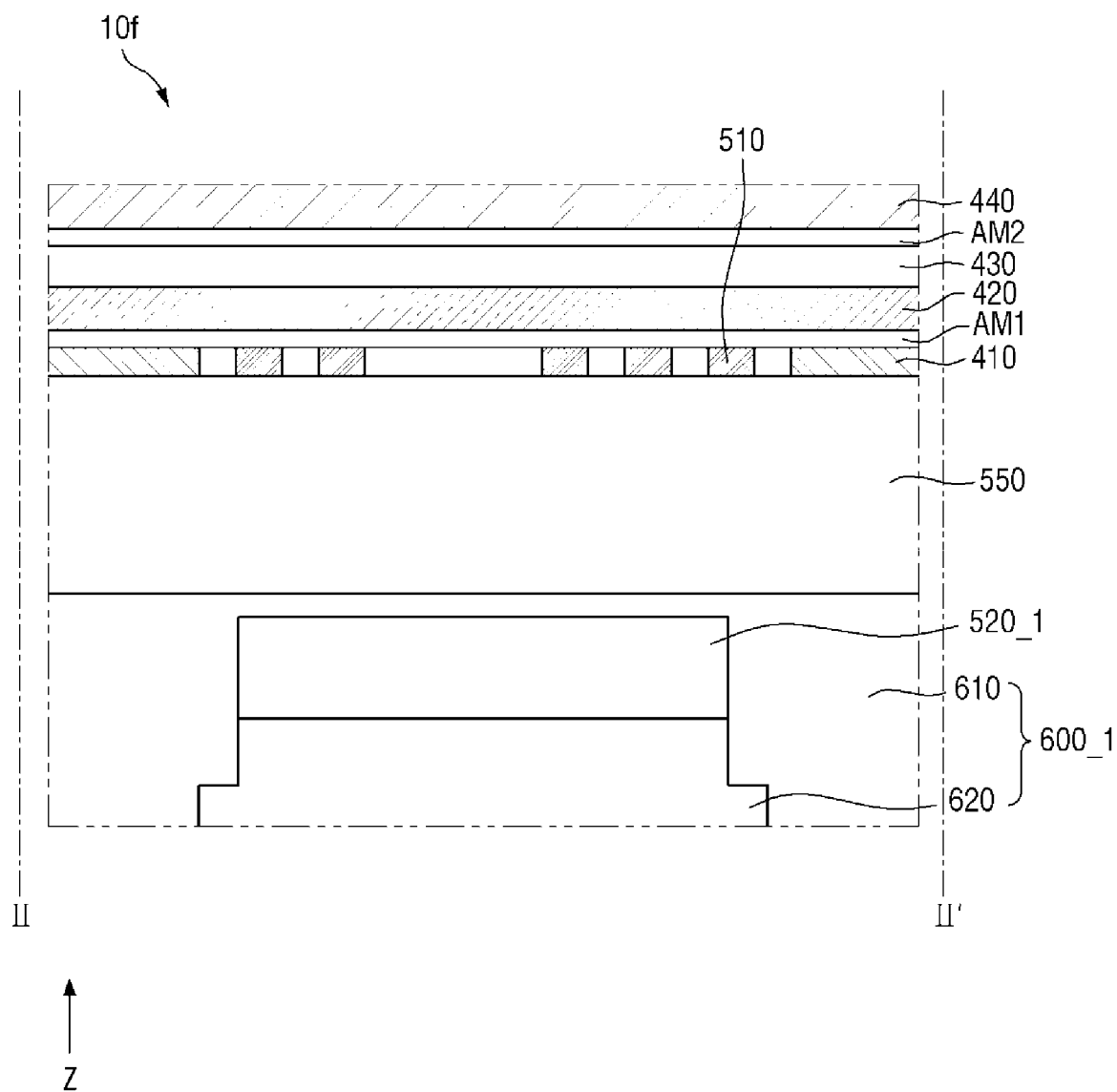
FIG. 20 is a cross-sectional view taken along line II-II' of FIG. 3 of another exemplary embodiment of the display device.

FIG. 20 is a cross-sectional view taken along line II-II' of FIG. 3 of another exemplary embodiment of the display device.

Referring to FIG. 20, the display device 10f according to the illustrated exemplary embodiment is different from the illustrated exemplary embodiment according to FIG. 19 in that the sound frame 530_1 and the spring 540 are omitted.

More specifically, in the display device 10f according to the illustrated exemplary embodiment, the sound frame 530_1 and the spring 540 are omitted, and a sound buffer member 550 may be further disposed between the panel lower sheet 400 and the bracket 600_1. The sound buffer member 550 may come into contact with the panel lower sheet 400 and the bracket 600_1.

The sound buffer member 550 may serve as the spring 540 to dampen vibrations when the display device 10f including the display panel 300 vibrates due to the sound generator. The sound buffer member 550 may be a single layer or multilayer. For example, the sound buffer member 550 may be formed of a polymer resin such as a polyurethane, a polycarbonate, a polypropylene, a polyethylene, or the like or an elastic material such as a rubber, a urethane-based material, a sponge in which an acrylic material is foam-molded, or the like. The sound buffer member 550 may be a cushion layer.

Figure 21:
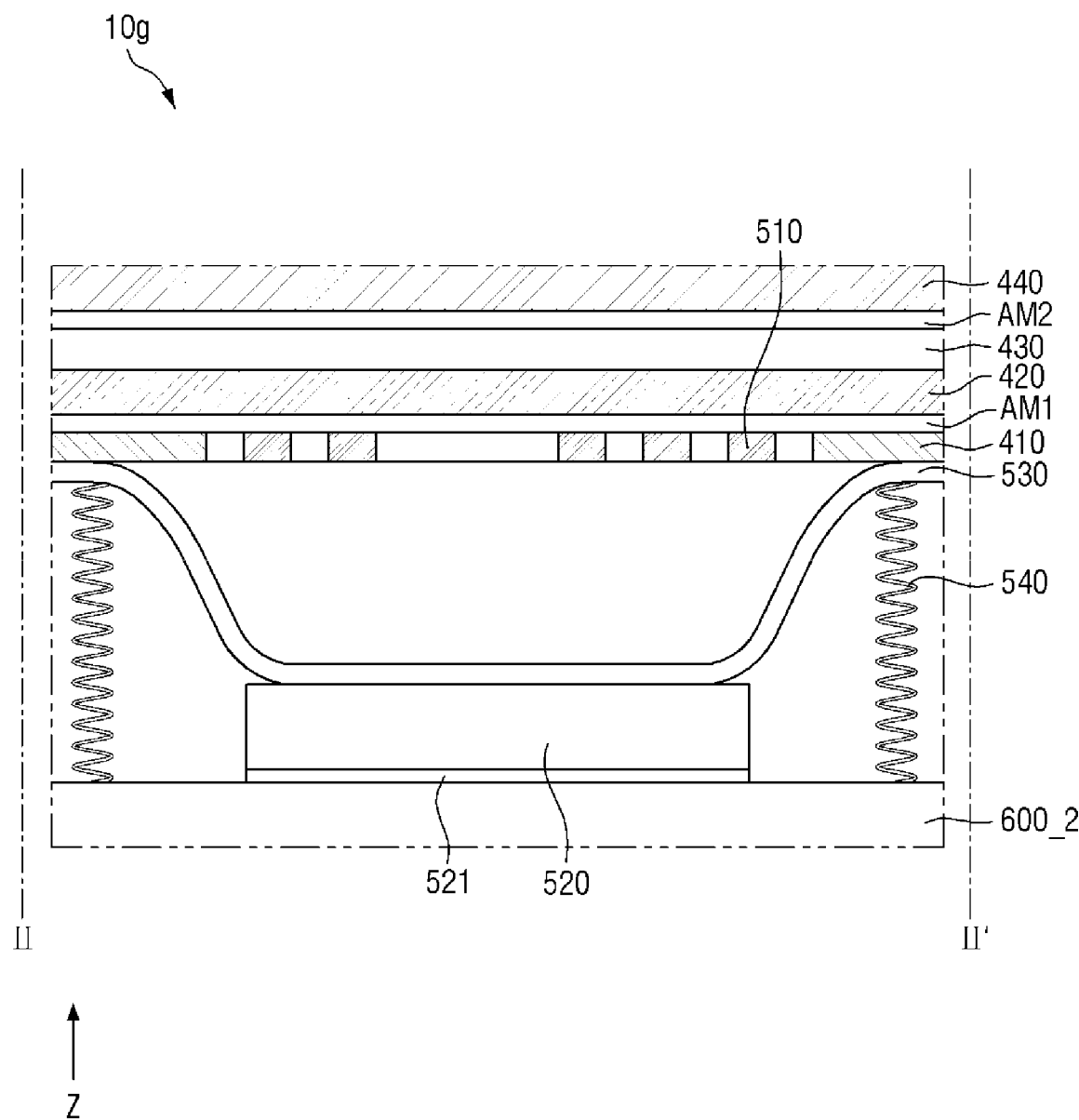
FIG. 21 is a cross-sectional view taken along line II-II' of FIG. 3 of yet another exemplary embodiment of the display device.
Figure 22:
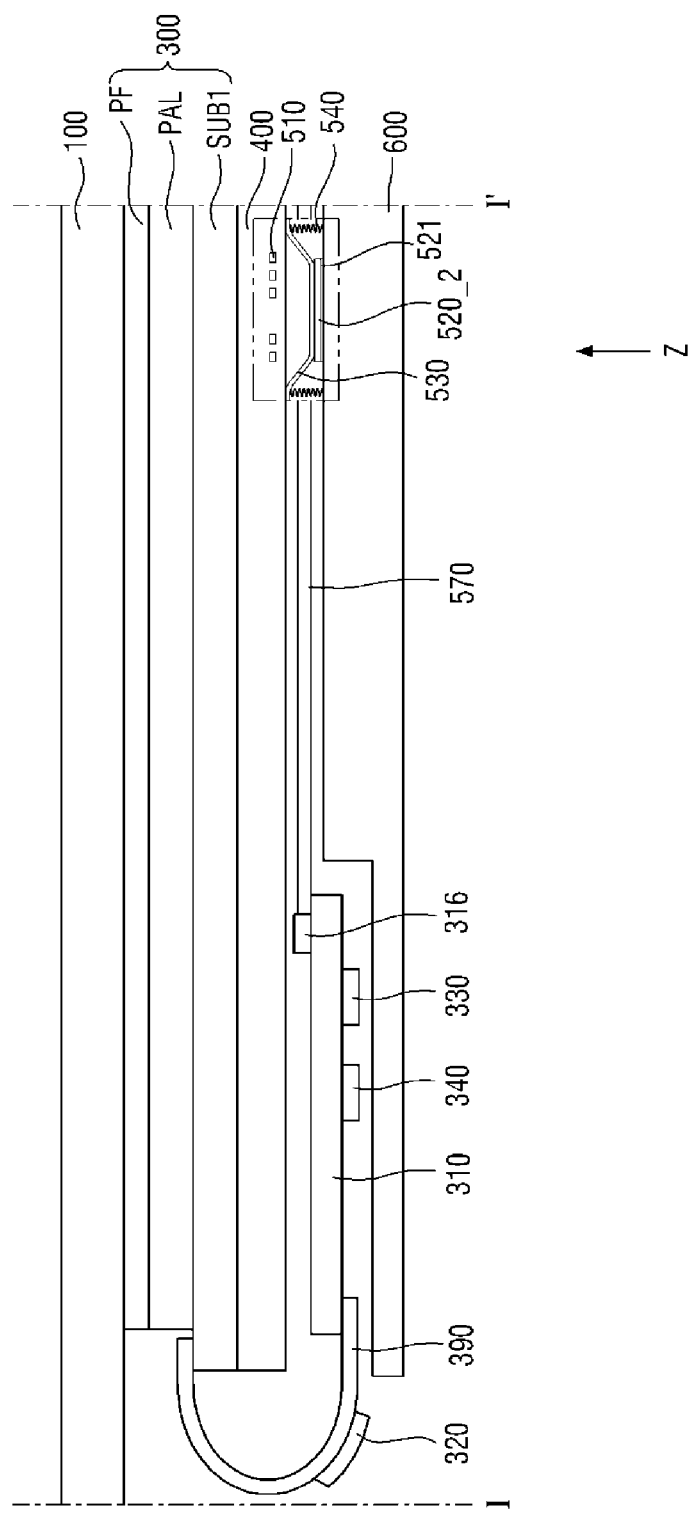
FIG. 22 cross-sectional view of yet another display device constructed according to principles of the invention.

FIG. 21 is a cross-sectional view taken along line II-II' of FIG. 3 of yet another exemplary embodiment of the display device.

Referring to FIG. 21, the display device 10g according to the illustrated exemplary embodiment is different from the illustrated exemplary embodiment according to FIG. 6 in that the bracket 600 does not include the indented part IDP shown in FIG. 6 and is formed of only a substantially flat part, and a fixed magnetic field generation member 520_2 is disposed on the substantially flat part. Because other descriptions are described in FIG. 6, overlapping descriptions will be omitted to avoid redundancy.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel including a plurality of pixels;
   a layer disposed on one surface of the display panel and including a substantially flat coil to induce a magnetic field; and
   a support spaced apart from the display panel with the layer interposed therebetween and having a fixed magnetic field generation member disposed therein,
   wherein:
   the layer comprises a panel lower sheet including a first heat dissipation layer and an adhesive member;
   the adhesive member comprises a first surface facing the display panel and a second surface opposite to the first surface, the substantially flat coil and the first heat dissipation layer directly contact the second surface of the adhesive.

2. The display device of claim 1, further comprising a second heat dissipation layer disposed between the first heat dissipation layer and the display panel,
wherein:
the first heat dissipation layer includes copper or silver; and
the second heat dissipation layer includes graphite or a carbon nanotube.

3. The display device of claim 2, wherein:
the first heat dissipation layer is spaced apart from the substantially flat coil.

4. The display device of claim 1, wherein the fixed magnetic field generation member comprises a magnet overlapping the substantially flat coil in a thickness direction.

5. The display device of claim 4, wherein:
the support comprises a bracket including a first bracket part in which the magnet is disposed and a second bracket part in which the magnet is not disposed;
the first bracket part extending downward more than the second bracket part; and
the magnet is embedded in the first bracket part.

6. The display device of claim 5, further comprising a sound frame disposed on the magnet and overlapping the substantially flat coil.

7. The display device of claim 6, further comprising a damper to disposed between the second bracket part and the sound frame, the damper contacting the second bracket part and the sound frame.

8. The display device of claim 4, wherein the magnet is disposed in the support.

9. The display device of claim 8, further comprising a buffer member disposed between the panel lower sheet and the support, the support comprising a bracket;
wherein the buffer member contacts the panel lower sheet and the bracket.

10. The display device of claim 1, further comprising a printed circuit board attached to one end of the display panel, and bent to be disposed between the support and the layer;
wherein the substantially flat coil is electrically connected to the printed circuit board through a connection member.

11. A display device comprising:
a display panel including a plurality of pixels;
a layer disposed on one surface of the display panel and including a substantially flat coil to induce a magnetic field, the layer comprising a lower sheet, the lower sheet including a heat dissipation layer and an adhesive member;
a support spaced apart from the display panel with the layer interposed therebetween and having a fixed magnetic field generation member disposed therein, the support comprising a bracket; and
a printed circuit board attached to one end of the display panel, and bent to be disposed between the bracket and the lower sheet;
wherein:
the substantially flat coil overlaps the fixed magnetic field generation member in a thickness direction, and the printed circuit board overlaps the substantially flat coil in the thickness direction;
the heat dissipation layer includes a lower heat dissipation layer, and an upper heat dissipation layer disposed between the lower heat dissipation layer and the display panel;
the adhesive member comprises a first surface facing the display panel and a second surface opposite to the first surface,
the adhesive member is disposed between the lower heat dissipation layer and the upper heat dissipation layer, and
the substantially flat coil and the lower heat dissipation layer directly contact the second surface of the adhesive member or the substantially flat coil and the upper heat dissipation layer directly contact the first surface of the adhesive member.

12. The display device of claim 11, wherein the fixed magnetic field generation member comprises a magnet.

13. The display device of claim 11, wherein:
the lower heat dissipation layer includes copper or silver; and
the upper heat dissipation layer includes a graphite or a carbon nanotube.

* * * * *